United States Patent
Ficek et al.

(10) Patent No.: US 9,927,704 B2
(45) Date of Patent: Mar. 27, 2018

(54) LIQUID RADIATION CURABLE RESINS CAPABLE OF CURING INTO LAYERS WITH SELECTIVE VISUAL EFFECTS AND METHODS FOR THE USE THEREOF

(75) Inventors: Beth Ficek, Bartlett, IL (US); John Southwell, Glen Ellyn, IL (US); Brett Register, Wonder Lake, IL (US)

(73) Assignee: DSM IP ASSETS, B.V., Heerlen (NL)

( * ) Notice: Subject to any disclaimer, the term of this patent is extended or adjusted under 35 U.S.C. 154(b) by 1017 days.

(21) Appl. No.: 13/522,749

(22) PCT Filed: Jan. 21, 2011

(86) PCT No.: PCT/US2011/022010
§ 371 (c)(1),
(2), (4) Date: Jul. 18, 2012

(87) PCT Pub. No.: WO2011/091228
PCT Pub. Date: Jul. 28, 2011

(65) Prior Publication Data
US 2012/0295077 A1    Nov. 22, 2012

Related U.S. Application Data

(60) Provisional application No. 61/297,467, filed on Jan. 22, 2010, provisional application No. 61/392,153, filed on Oct. 12, 2010.

(51) Int. Cl.
*B29C 35/08* (2006.01)
*B32B 3/10* (2006.01)
(Continued)

(52) U.S. Cl.
CPC ............ *G03F 7/105* (2013.01); *B29C 64/106* (2017.08); *G03F 7/002* (2013.01); *G03F 7/0037* (2013.01);
(Continued)

(58) Field of Classification Search
CPC .................................................... G03F 7/0037
See application file for complete search history.

(56) References Cited

U.S. PATENT DOCUMENTS 5,176,188 A    5/1993   Quinn
5,364,889 A   11/1994   Quinn
(Continued)

FOREIGN PATENT DOCUMENTS

DE    19606210 A1 *  8/1997  .............. B22C 7/00
EP     0 499 486        8/1992
(Continued)

OTHER PUBLICATIONS

Machine translation of DE19606210.*
(Continued)

*Primary Examiner* — Ian Rummel
(74) *Attorney, Agent, or Firm* — Daniel S. Bujas

(57) ABSTRACT

The invention relates to a method for forming a liquid radiation curable resin capable of curing into a solid upon irradiation comprising at least one thermally sensitive visual effect initiator. The liquid radiation curable resin is capable of curing into three-dimensional articles having selective visual effects. The resulting three-dimensional articles possess excellent color and/or transparency stability and excellent mechanical properties.

15 Claims, 5 Drawing Sheets

(51) Int. Cl.
  *G03F 7/105* (2006.01)
  *G03F 7/00* (2006.01)
  *B29C 64/106* (2017.01)
  *B33Y 10/00* (2015.01)

(52) U.S. Cl.
  CPC ............ *B29K 2995/002* (2013.01); *B29K 2995/0026* (2013.01); *B33Y 10/00* (2014.12); *Y10T 428/24802* (2015.01)

(56) References Cited

U.S. PATENT DOCUMENTS

| | | | |
|---|---|---|---|
| 5,500,040 A | | 3/1996 | Fujinami |
| 5,514,519 A | | 5/1996 | Neckers |
| 5,677,107 A | | 10/1997 | Neckers |
| 5,902,538 A | * | 5/1999 | Kruger .............. B29C 41/12 264/308 |
| 5,942,370 A | | 8/1999 | Neckers |
| 5,942,554 A | | 8/1999 | Ren |
| 6,008,269 A | | 12/1999 | Kitagawa |
| 6,133,336 A | * | 10/2000 | Popat .............. B29C 67/0066 264/401 |
| 6,200,646 B1 | | 3/2001 | Neckers |
| 6,514,446 B1 | | 2/2003 | Smith |
| 6,649,311 B1 | | 11/2003 | Shirley |
| 6,746,814 B2 | | 6/2004 | Coe |
| 6,811,937 B2 | | 11/2004 | Lawton |
| 2002/0086247 A1 | | 7/2002 | Coe |
| 2004/0076909 A1 | | 4/2004 | Shirley |
| 2008/0090726 A1 | * | 4/2008 | Eskra et al. .............. 503/207 |
| 2008/0258345 A1 | * | 10/2008 | Bens et al. .............. 264/401 |

FOREIGN PATENT DOCUMENTS

| | | |
|---|---|---|
| EP | 0 535 984 | 4/1993 |
| EP | 1 448 654 | 9/2006 |
| JP | 60-168615 | 9/1985 |
| JP | 60168615 | 9/1985 |
| JP | 2116537 | 5/1990 |
| WO | WO 1995/001257 | 1/1995 |
| WO | WO 1997/09168 | 3/1997 |
| WO | WO 00/07071 | 2/2000 |

OTHER PUBLICATIONS

International Search Report for PCT/US2011/022010, dated Jul. 4, 2011.
Hikmet et al., "Patterned Multicolor Switchable Cholesteric Liquid Crystal Gels", *Advanced Materials*, vol. 14, No. 7, 2002, pp. 502-504.
Database WPI, Week 198541, Thomson Scientific, London, GB; AN 1985-253503, XP002629722, & JP 60 168615 A (Fujitsu Ltd) Sep. 2, 1985.

* cited by examiner

LIQUID RADIATION CURABLE RESINS
CAPABLE OF CURING INTO LAYERS WITH
SELECTIVE VISUAL EFFECTS AND
METHODS FOR THE USE THEREOF

This application is a U.S. national phase application of International Application No. PCT/US2011/022010 filed 21 Jan. 2011 which designated the U.S. and claims priority to U.S. Provisional Applications No. 61/297,467 filed 22 Jan. 2010 and No. 61/392,153 filed 12 Oct. 2010, each of which are hereby incorporated by reference in their entirety as if fully set forth herein.

FIELD OF THE INVENTION

The present invention relates to radiation curable resins suitable for use in forming three dimensional articles using additive fabrication processes.

BACKGROUND OF THE INVENTION

Additive fabrication processes for producing three dimensional articles are known in the field. Additive fabrication processes utilize computer-aided design (CAD) data of an object to build three-dimensional parts layer-by-layer. These three-dimensional parts may be formed from liquid resins, powders, or other materials.

A non-limiting example of an additive fabrication process is stereolithography (SL). Stereolithography is a well-known process for rapidly producing models, prototypes, patterns, and production parts in certain applications. SL uses CAD data of an object wherein the data is transformed into thin cross-sections of a three-dimensional object. The data is loaded into a computer which controls a laser beam that traces the pattern of a cross section through a liquid radiation curable resin composition contained in a vat, solidifying a thin layer of the resin corresponding to the cross section. The solidified layer is recoated with resin and the laser beam traces another cross section to harden another layer of resin on top of the previous layer. The process is repeated layer by layer until the three-dimensional object is completed. When initially formed, the three-dimensional object is, in general, not fully cured and therefore may be subjected to post-curing, if required. An example of an SL process is described in U.S. Pat. No. 4,575,330.

The liquid radiation curable resin used in stereolithography and other additive fabrication processes for forming three-dimensional objects can be solidified by light energy. Typically, liquid radiation curable resins are cured by ultraviolet (UV) light. Such light is typically produced by lasers (as in stereolithography), lamps, or light emitting diodes (LEDs). See PCT Patent Application PCT/US10/60677, filed on Dec. 16, 2010, and incorporated by reference in its entirety. The delivery of energy by a laser in a stereolithography system can be Continuous Wave (CW) or Q-switched pulses. CW lasers provide continuous laser energy and can be used in a high speed scanning process.

With known resins, it is typical that the final color and/or clarity develops in the three dimensional article as it is cured. Known resins may be clear in liquid forms and form opaque three-dimensional articles upon cure. Other known resins may be colorless in liquid form and capable of curing into colored three-dimensional articles. Furthermore, some resins appear as a first color in liquid form and turn a second color upon cure.

Throughout this patent application the term color is defined as follows: color (or colour, alternative spelling) is the visual perceptual property corresponding in humans to the categories called red, yellow, green, etc. Black is the visual perception of absence of all color, whereas white is the visual perception of all colors. Color derives from the spectrum of light (distribution of light energy versus wavelength) interacting in the eye with the spectral sensitivities of the light receptors. Color categories and physical specifications of color are also associated with objects, materials, light sources, etc., based on their physical properties such as light absorption, reflection, or emission spectra. Typically, only features of the composition of light that are detectable by humans (wavelength spectrum from 400 nm to 700 nm, roughly) are included, thereby objectively relating the psychological phenomenon of color to its physical specification.

Color and transparency are two distinct principles. For instance, something may visually appear perfectly clear and still colored. For instance, certain colored glass is entirely transparent to the eye and possesses a color. Similarly, something may be colorless and also clear or opaque. Colorless is defined as lacking all color. For instance, pure liquid water is clear and colorless. An article that is visually perceived as perfectly clear and as a color, for instance, blue, is reflecting the blue color while allowing all other wavelengths of light to pass through. When a viewer perceives white, the article will appear less transparent because all colors are being reflected back at the viewer and thus not passing through the article.

In recent years, the demand for liquid radiation curable resins that produce three-dimensional articles that have excellent dimensional accuracy, shape stability, mechanical properties, and the like has increased. Along with this development, demand has grown for three-dimensional articles that possess a desired color or transparency/opacity, and also have the mentioned excellent properties. These colored three-dimensional articles are useful because they are aesthetically pleasing, can mimic the appearance of commercial materials, and may possess light-shielding properties. Along with this development, the demand for radiation-curable compositions in which the color or opacity can be selectively controlled during curing has also increased.

Meeting the challenges of producing selectively colored three-dimensional articles is described in U.S. Pat. No. 6,133,336, issued Oct. 17, 2000 and assigned to Zeneca Limited. This patent describes a method of curing and adding color to a three-dimensional article using light at a single wavelength, and at a lower and a higher dose. The lower dose of light is used to cure the liquid resin to form a solid and the higher dose of light is used to add color to the resin. The process claimed is only for adding color, not removing color. This patent also claims a composition for a photocurable and photocolorable resin. However, the disclosed composition has poor mechanical properties and poor color stability. For instance, after initial curing, the uncolored sections of the article become colored over time in ambient light. Such problems are common with photoresponsive coloring techniques.

U.S. Pat. No. 5,677,107, assigned to Spectra Group Limited, Inc., discloses a method for preparing and selectively coloring a three-dimensional article by adding or removing color. The coloring agent is photoresponsive and the method claimed is dependent on using a photoresponsive coloring agent.

U.S. Pat. No. 5,942,554, assigned to Spectra Group Limited, Inc., discloses a method of effecting color change in polymeric bodies of either thermal curable or photocurable resins. The color-changing compound is sensitive to acid produced during polymerization of the resin. The acid is produced from the initiating species which are activated by either light or temperature. The color change occurs when the coloring agent is exposed to the acid.

U.S. Pat. No. 6,664,024, assigned to American Dye Source, Inc., disclose a photocurable resin composition for forming three-dimensional objects that can be selectively colored that utilizes a photoactivated coloring compound.

U.S. Pat. No. 6,649,311, assigned to Vantico Limited, discloses a resin for use in forming three-dimensional objects that can use a photosensitive coloring compound contained in microcapsules. Similarly, U.S. Published Patent Application No. 2004/0076909 discloses a liquid resin composition for use in forming three-dimensional objects which comprises particles dispersed in the composition which are micro-capsules containing a photosensitive color changing composition.

U.S. Published Patent Application No. 2004/0170923, assigned to 3D Systems, Inc., discloses colored resins useful in forming three-dimensional objects; however, such resins cannot be selectively colored by exposure to various doses of light.

U.S. Pat. No. 6,746,814, assigned to the inventor, discloses a method for selectively coloring or shading an article produced by overexposing the liquid resin to radiation during cure and then heating the entire model with an effective amount of heat in order to induce a color change in the overexposed sections of the article. No coloring or transparency modifying agent is used.

It would be desirable to develop a liquid radiation curable resin that can cure into a three-dimensional article wherein the color and/or transparency of the three-dimensional article can be selectively controlled to be substantially clear and/or colorless in some areas and have a desired color and/or transparency in other areas while having excellent mechanical properties. Moreover, it would be desirable to develop a liquid radiation curable resin wherein the color and/or transparency of the selectively controlled sections remain at a substantially constant color or no color, and/or transparency over time.

SUMMARY OF THE INVENTION

The first aspect of the instant claimed invention is a method of forming a three-dimensional article having at least one selectively colored and/or transparent region comprising subjecting a liquid radiation curable resin comprising at least one thermally sensitive visual effect initiator having an activation temperature to appropriate imaging radiation to form a three-dimensional article layer by layer, while simultaneously selectively controlling the temperature of the liquid radiation curable resin so that at least one portion of the liquid radiation curable resin is at or above the activation temperature of the thermally sensitive visual effect initiator to thereby form the at least one selectively colored and/or transparent region of the three-dimensional article.

The second aspect of the instant claimed invention is a three-dimensional article having at least one selectively colored and/or transparent region made using an additive fabrication process, wherein a liquid radiation curable resin used to create the article comprises from about 0.005 wt % to about 5 wt % of at least one thermally sensitive visual effect initiator.

The third aspect of the instant claimed invention is a liquid radiation curable resin wherein the liquid radiation curable resin composition comprises at least two thermally sensitive visual effect initiators.

The fourth aspect of the instant claimed invention is a method of forming a three-dimensional article having regions of selective color and/or transparency from a liquid radiation curable resin comprising the steps:

curing a layer of a liquid radiation curable resin using light, thereby forming a cured solid polymeric layer;

irradiating selected areas of the cured solid polymeric layer resulting from step (a), a previously cured solid polymeric layer, or a layer of the liquid radiation curable resin with a higher dose of light than used in step (a) thereby removing color and/or altering the transparency of the areas irradiated with the higher dose of light.

repeating steps (a) and (b) on a previously cured solid polymeric layer or a layer of the liquid radiation curable resin, as necessary, until the desired three-dimensional article having selectively colored and/or transparent regions is formed;

wherein the wavelength(s) of light in each of steps (a) and (b) are the same, and step (b) can be performed before, during, or after step (a).

The fifth aspect of the instant claimed invention is a method of forming a three-dimensional article having selectively colored and/or transparent regions made from a liquid radiation curable resin wherein the coloration and/or transparency of the selectively colored and/or transparent regions is created by selectively controlling the temperature of the liquid radiation curable resin.

The sixth aspect of the instant claimed invention is a three-dimensional article having colored and uncolored sections produced via an additive fabrication process that when exposed to fluorescent light for 30 days at ambient temperature attains a $\Delta E^*$ measured throughout the exposure to fluorescent light that remains within 50% of the $\Delta E^*$ measured on the first day of the exposure to fluorescent light, preferably the $\Delta E^*$ measured through the exposure to fluorescent light remains within 30% of the $\Delta E^*$ measured on the first day of the exposure to fluorescent light, more preferably the $\Delta E^*$ measured through the exposure to fluorescent light remains within 15% of the $\Delta E^*$ measured on the first day of the exposure to fluorescent light, even more preferably the $\Delta E^*$ measured through the exposure to fluorescent light remains within 10% of the $\Delta E^*$ measured on the first day of the exposure to fluorescent light.

The seventh aspect of the instant claimed invention is a method of forming a three-dimensional article having selectively colored and/or transparent regions from a liquid radiation curable resin comprising the steps of
  a. selectively curing a layer of liquid radiation curable resin with at least two different doses of light thereby forming a cured solid layer with selectively colored and/or transparent regions
  b. juxtaposing at least two cured solid layers formed from step (a) in order to form a three-dimensional article.

The eight aspect of the instant claimed invention is a liquid radiation curable resin composition capable of curing into a solid upon irradiation comprising from 0.005 wt % to 5 wt % of at least one thermally sensitive visual effect initiator, preferably from 0.005 wt % to 3 wt. %, more preferably from 0.005 wt % to 2.5 wt. %, even more preferably from 0.005 wt % to 1 wt %, even more preferably from 0.005 wt % to 0.5 wt %, of the at least one thermally sensitive visual effect initiator.

DETAILED DESCRIPTION OF THE INVENTION

Figure 1:
FIG. 1, FIG. 2, FIG. 3, and FIG. 4 show cured three-dimensional articles illustrative of the invention.

This application claims priority from U.S. Provisional Patent Application 61/297,467 filed Jan. 22, 2010 and U.S. Provisional patent Application 61/392,153 filed Oct. 12, 2010, both hereby incorporated by reference in their entirety.

Throughout this patent application, a thermally sensitive visual effect initiator is defined as a component capable of incorporation into a liquid radiation curable resin that can be used to form three-dimensional objects and that upon cure is capable of creating a change in the color or transparency of a three-dimensional article made therefrom in response to temperature. Generally, thermally sensitive visual effect initiators can be placed into one or both of two categories: 1) components that affect color; and 2) components that affect transparency.

The activation temperature of a thermally sensitive visual effect initiator is defined as the temperature at which the thermally sensitive visual effect initiator component begins to exhibit a color and/or transparency change. The locking temperature of a thermally sensitive visual effect initiator is the temperature at which any change in color and/or transparency of the thermally sensitive visual effect initiator, or the liquid resin or three-dimensional article made therefrom when a thermally sensitive visual effect initiator is incorporated into a liquid radiation curable resin, will be permanent or semi-permanent. Permanent color change is irreversible color change. Semi-permanent color change is reversible under certain circumstances; i.e. to reverse the color change the thermochromic component would have to be cooled significantly below room temperature. Non-permanent color change is any color change that occurs that is not permanent or semi-permanent. Non-permanent color change is reversible.

Throughout this patent application, thermochromism is defined as the ability of a substance to change color due to a change in temperature. A thermochromic component is a component capable of incorporation into a liquid radiation curable resin that has the ability to change color due to a change in temperature. A thermally sensitive transparency modifier is a component capable of incorporation into a liquid radiation curable resin that has the ability to change the transparency of a liquid radiation curable resin or a three dimensional article made therefrom due to a change in temperature. The transparency is typically changed by modifying the light scattering properties of the selectively cured section of the three-dimensional article produced from a liquid radiation curable resin. A thermochromic component can also be a thermally sensitive transparency modifier and a thermally sensitive transparency modifier can also be a thermochromic component. In fact, even a component that is substantially thermochromic will often also affect the visual transparency of the three-dimensional article in some small way. A thermally sensitive visual effect initiator may be a thermochromic component, a thermally sensitive transparency modifier, or both.

Throughout this patent application, a microcapsule is a tiny particle capable of encapsulating other components. The heat of polymerization of the resin is the heat given off by the exothermic reaction of polymerization. Intensity is defined as the time-averaged power per unit area. Dose is the total power per unit area.

The first aspect of the instant claimed invention is a method of forming a three-dimensional article having at least one selectively colored and/or transparent region comprising subjecting a liquid radiation curable resin comprising at least one thermally sensitive visual effect initiator having an activation temperature to appropriate imaging radiation to form a three-dimensional article layer by layer, while simultaneously selectively controlling the temperature of the liquid radiation curable resin so that at least one portion of the liquid radiation curable resin is at or above the activation temperature of the thermally sensitive visual effect initiator to thereby form the at least one selectively colored and/or transparent region of the three-dimensional article. Appropriate imaging radiation is radiation sufficient to cure a liquid radiation curable resin layer by layer in order to form a three-dimensional article. In an embodiment, the thermally sensitive visual effect initiator is a thermochromic component. In another embodiment, the thermally sensitive visual effect initiator is a thermally sensitive transparency modifier. In another embodiment, the thermally sensitive visual effect initiator is both a thermochromic component and a thermally sensitive transparency modifier. In further embodiments, the liquid radiation curable composition comprises a mixture of various thermally sensitive visual effect initiators.

To selectively control the color and/or transparency of a liquid radiation curable resin comprising a thermally sensitive visual effect initiator, the resin temperature must reach the activation temperature of the thermally sensitive visual effect initiator, and preferably reach the locking temperature. In order to reach the activation and locking temperatures in selected areas, the local temperature of the resin in select areas must be selectively controlled. A thermally sensitive visual effect initiator of any activation or locking temperature may be used as long as the local temperature of the liquid radiation curable resin can be appropriately controlled in selected areas.

The local temperature of the resin is dependent on the heat of polymerization of the liquid radiation curable resin, the amount of liquid radiation curable resin polymerized, and any heating or cooling provided by outside sources, such as heating elements on the additive fabrication machine. A selective visual effect can be created by controlling the local temperature in any one, or a combination, of these ways.

The heat of polymerization of a liquid radiation curable resin is dependent on the composition of the resin. The heat of polymerization of many compounds can be found in Brandrup et al, *Polymer Handbook,* 4th Edition, 2003. Depending on the type of additive fabrication machine used, a lower heat of polymerization can be somewhat compensated for by altering the vat temperature, if a vat is present on the particular machine, or local heating element, if present on the particular machine, by providing a greater dose of light, or by increasing the layer thickness.

The heat of polymerization of a liquid radiation curable resin can be measured using Differential Scanning calorimeter (DSC), for instance, a TA instruments Differential Scanning calorimeter Model Q2000 with a photocalorimeter accessory (PCA) model S2000. For example, a 10 mg sample can be placed in a Tzero aluminum pan. The sample should be held isothermally at 30° C. for 1 minute to mimic a typical curing temperature of a liquid radiation curable resin. The sample can then be illuminated for 6 sec with an appropriate light source, for example a 200 W mercury arc lamp with appropriate filter, for instance a 365 nm filter, at 500 mW/cm$^2$. It is preferred that liquid radiation curable resins that produce greater than approximately 145+/−20 J/g at 500 mW/cm$^2$ be used for the instant claimed invention. However, liquid radiation curable resins that produce less heat could be used in the instant claimed invention by increasing the dose of light, thickness of layer cured, or adjusting various parameters of the additive fabrication machine that may affect temperature (such as vat temperature or the output of a local heating element).

The amount of resin polymerized is dependent on the dose of light delivered to the liquid radiation curable resin and the thickness of the layer cured. A higher amount of energy being transferred to each area will initiate more polymerization in that area of the liquid radiation curable resin composition. The increased amount of polymerization will result in an increased temperature in that area, thus enabling the local temperature of the area to be selectively controlled. Generally, a resin that has a lower heat of polymerization will require a thicker layer be cured, thus initiating more polymerization per layer and raising the level of heat produced. Similarly, resins with higher critical energy (Ec) and lower depth of penetration (Dp) values, as determined by the working curve method well known in the art, may require thicker layers and/or a higher light dose to be built in order achieve the requisite local temperature to selectively control the color and/or transparency of the three-dimensional article.

The local temperature can be at least partially controlled by adjusting various parameters on the additive fabrication machine. In an embodiment where the particular type of additive fabrication machine used has a vat, for instance a stereolithography machine, the temperature is at least partially controlled by adjusting the vat temperature and by adjusting the intensity of light used to cure the liquid radiation curable resin. In another embodiment, the temperature of the thermally sensitive visual effect initiator is controlled by a local heating element at the location of polymerization and by adjusting the intensity of light used to cure the liquid radiation curable resin. In a further embodiment, the local temperature is controlled only by a local heating element. If a stereolithography machine is not used, similar settings for adjusting the resin temperature, light intensity, or local heating element can be adjusted to impact the local temperature of the resin. On some stereolithography machines, the light intensity can be controlled by increasing or decreasing the layer hatch overcure on the selected areas of the resin. The layer hatch overcure is the amount of energy that is being put into the layer. The machine setting called layer hatch overcure may be referred to differently on different stereolithography machine makes and models. The stereolithography machine uses the layer hatch overcure to calculate the light source power and speed to form the proper layer. Those skilled in the art of additive fabrication machine operation know how to adjust an additive fabrication machine in order to manipulate the liquid radiation curable resin temperature and the light intensity in certain areas. A single light source or multiple light sources may be used to cure and/or heat the liquid radiation curable resin.

The use of thermally sensitive visual effect initiators has several advantages over the current state of the art. First, the thermally sensitive visual effect initiators can be used with a hybrid curing system. A hybrid curing system is a curing system consisting of free-radical and cationic photoinitiators along with free-radical and cationic polymerizable components. When a non-hybrid system is subject to irradiation in order to form a three-dimensional article, the formed three-dimensional article possesses undesirable physical properties. Hybrid systems allow for three-dimensional articles that possess excellent mechanical properties. In the current state of the art of liquid radiation curable resin for additive fabrication that are capable of selective coloration in an additive fabrication process, for instance in U.S. Pat. No. 6,133,336, halochromic components are used to effectuate the selective coloring. Halochromic components change color based pH. Such components are not effective with a hybrid curing system unless they can be appropriately contained and shielded from the acid present during cationic polymerization. If the halochromic components are not appropriately contained, for instance in a microcapsule impermeable to acid, the acid created from the cationic photoinitiating system will react with the halochromic components and cause the halochromic components to change color. Thermochromic components can be made to be much more acid-stable than certain photosensitive or halochromic coloring agents and are thus able to work in a hybrid curing system. In an embodiment, a non-hybrid curing system is used. In another embodiment, a hybrid curing system is used. In an embodiment, the thermally sensitive visual effect initiator does not undergo any significant visual color or transparency change in response to the acid produced during the polymerization of the liquid radiation curable resin. In an embodiment the thermally sensitive visual effect initiator comprises a microcapsule that is impermeable to acid. In another embodiment the thermally sensitive visual effect initiator comprises a microcapsule that is substantially impermeable to acid.

Second, the longevity of the selective coloring in a selectively colored three-dimensional article can be much greater with a thermally sensitive visual effect initiator than with current state of the art coloring components capable of selective coloration. Thermally sensitive visual effect initiators may or may not be photosensitive, or may be much less photosensitive than other photosensitive coloring agents. Articles that are selectively colored using current state of the art coloring components capable of selective coloration are often subject to what appears to be color bleeding. Furthermore, the color immediately after cure changes substantially as time progresses after cure. This occurs because, as the halochromic or photosensitive coloring agents are exposed to ambient light, the coloring agent, or the developer or photoinitiator that activates the coloring agent in the case of certain halochromic coloring systems, is triggered in ambient light. This leads to additional unwanted color forming over time in the uncolored sections. Articles that are selectively colored using thermally sensitive visual effect initiators, which are generally not photosensitive, are subject to less color bleeding. Moreover, such articles possess substantially the same color as time progresses after cure as they do immediately after cure. In an embodiment, the thermally sensitive visual effect initiator is not photosensitive. In another embodiment, the thermally sensitive visual effect initiator is slightly photosensitive.

In an embodiment, the thermally sensitive visual effect initiator is a microcapsule that contains a thermally sensitive component or components. The origin of the visual effect can occur from changes in light absorption, light reflection, and/or light scattering with temperature. Thermally sensitive visual effect initiators can be present in various types of compounds. A write-up of thermochromism in polymers can be found in *Thermochromic Phenomena in Polymers*, © 2008 Arno Seeboth and Detlef Lötzsch. Additional information concerning thermochromic compounds can be found in *Organic Photochromic and Thermochromic Compounds*, Volume 2, © 1999 John C. Crano and Robert J. Guglielmetti. Examples of thermochromic components can be found in U.S. Pat. Nos. 7,304,008, 6,008,269, and 4,424,990, and in WO/2009/137709. Other thermochromic compounds can be found in, for instance, Japanese patent publications 2005-220201, 2007-332232, 2003-313453, 2001-242249, 10-152638, 03-076783, 03-076786, and 1522236.

Surprisingly, a thermally sensitive visual effect initiator can be incorporated into a liquid radiation curable resin without any substantial reduction in the mechanical properties of the resin. In an embodiment, the thermally sensitive visual effect initiator is incorporated into a liquid radiation curable resin by mixing the thermally sensitive visual effect initiator into the liquid radiation curable resin. In an embodiment, the thermally sensitive visual effect initiator is incorporated into a liquid radiation curable resin by mixing the liquid radiation curable resin into the thermally sensitive visual effect initiator. In an embodiment, the thermally sensitive visual effect initiator is incorporated into the liquid radiation curable resin along with the solvent which contains the thermally sensitive visual effect initiator and, in another embodiment, without the solvent.

To determine the appropriate amount of thermally sensitive visual effect initiator to use in a liquid radiation curable resin composition, a visual inspection of the part after cure can be made. The amount of thermally sensitive visual effect initiator in the liquid radiation curable resin composition is largely a function of visual preference. However, if too much or too little of the thermally sensitive visual effect initiator is incorporated into the liquid radiation curable resin composition, the selectively colored sections of the cured article may not be sufficiently distinct or the cured article may not be sufficiently transparent or opaque. As the particle size of the thermally sensitive visual effect initiator is reduced, more thermally sensitive visual effect initiator can be added to have sufficiently distinct selectively colored/uncolored and/or transparent/opaque portions of the cured article. In an embodiment, the thermally sensitive visual effect initiator is present in an amount less than about 5 wt %. In another embodiment the amount of thermally sensitive visual effect initiator is less than about 1 wt %. In another embodiment the amount of thermally sensitive visual effect initiator is less than about 0.5 wt %. In another embodiment the amount of thermally sensitive visual effect initiator is less than about 0.2 wt %. In another embodiment the amount of thermally sensitive visual effect initiator is less than about 0.1 wt %. In another embodiment the amount of thermally sensitive visual effect initiator is about 0.1 wt %. In another embodiment, the amount of thermally sensitive visual effect initiator is about 0.024 wt %.

In another embodiment, the amount of thermally sensitive visual effect initiator is present in an amount from about 0.005 wt % to about 5 wt %. In another embodiment, the amount of thermally sensitive visual effect initiator is present in an amount from about 0.005 wt % to about 3 wt %. In another embodiment, the amount of thermally sensitive visual effect initiator is present in an amount from about 0.005 wt % to about 2 wt %. In another embodiment, the amount of thermally sensitive visual effect initiator is present in an amount from about 0.005 wt % to about 1 wt %. In another embodiment, the amount of thermally sensitive visual effect initiator is present in an amount from about 0.01 wt % to about 5 wt %. In another embodiment, the amount of thermally sensitive visual effect initiator is present in an amount from about 0.05 wt % to about 5 wt %. In another embodiment, the amount of thermally sensitive visual effect initiator is present in an amount from about 0.01 wt % to about 2 wt %.

In an embodiment, the thermally sensitive visual effect initiator is incorporated into Somos® WaterClear® Ultra 10122 liquid radiation curable resin. In another embodiment, the thermally sensitive visual effect initiator is incorporated into Somos® WaterShed® XC 11122 liquid radiation curable resin. Somos® WaterClear® Ultra 10122 and Somos® WaterShed® XC 11122 are liquid radiation curable resins manufactured by DSM Desotech, Inc. Both Somos® WaterClear® Ultra 10122 and Somos® WaterShed® XC 11122 are substantially colorless and transparent after full cure. Somos® WaterClear® Ultra 10122 comprises between 45-70 wt % of epoxies, 10-25 wt % of acrylates, 5-15 wt % of oxetane, 5-15 wt % of polyol, 5-15 wt % of photoinitiators, and 0-10 wt % of additives. Somos® WaterShed® XC 11122 comprises between 45-70 wt % of epoxies, 5-20 wt % of acrylate, 10-25 wt % of oxetane, 5-15 wt % of photoinitiators, and 0-10 wt % of additives.

In an embodiment, the thermally sensitive visual effect initiator is a thermochromic component. The thermochromic component generally operates to change the visually perceived color of the cured three-dimensional article, but the component may also have some effect on the transparency of the cured three-dimensional article. The use of thermochromic components comprising microcapsules in an ink composition that is polymerizable with UV light is disclosed in U.S. Pat. No. 5,500,040, incorporated herein by reference in its entirety. However, this patent does not mention the use of thermochromic components in liquid radiation curable resins for additive fabrication or the production of three-dimensional articles with selective visual effects. R. A. M. Hikmet and R. Polesso have demonstrated that the reflective properties of a cholesteric liquid crystal gel incorporated into a liquid radiation curable resin may be controlled by polymerizing the liquid radiation curable resin at various temperatures. The polymerization is used to lock in the orientation of the liquid crystals that have been aligned by the exposure to a certain temperature so that subsequent changes in temperature do not significantly change the color. Please see R. A. M. Hikmet and R. Polesso, "Patterned Multicolor Switchable Cholesteric Liquid Crystal Gels," Advanced Materials, 2002, 14, No. 7, April 4, hereby incorporated by reference. No methods of making cured three-dimensional objects having selectively colored regions are discussed.

In an embodiment, the thermochromic component is contained in Thermolock® 79s Pink to Clear, manufactured by Matsui Shikiso Chemical Co. Ltd., http://www.matsui-color.com/. Thermolock® 79s Pink to Clear is an ink containing thermochromic components. The thermochromic components are microcapsules containing thermally sensitive ink. Thermolock® 79s Pink to Clear contains thermochromic components incorporated into ethylcyclohexane and other components. Thermolock® 79s Pink to Clear utilizes microcapsules containing a leuco dye and other components. Thermolock® 79s Pink to Clear comprises about 50-53 wt % of ethylcyclohexane, about 14 wt % of thermochromic component, about 15 wt % of 2-butoxyethyl acetate, less than 0.1 wt % of formaldehyde, and other ingredients. Ethylcyclohexane evaporates over time once Thermolock® 79s Pink to Clear is exposed to air. Whenever a wt % of Thermolock® 79s Pink to Clear is referred to in this application, the wt % refers to Thermolock® 79s Pink to Clear before any substantial evaporation of ethylcyclohexane. In other embodiments, the thermochromic component turns from some other color to clear. For instance, the color may be blue, red, or green contained in Thermolock® 79s Blue to Clear, Thermolock® 79s Red to Clear, and Thermolock® 79s Green to Clear, respectively.

In an embodiment, the thermochromic component is present in an amount less than about 5 wt % of the liquid radiation curable resin. In another embodiment the amount of thermochromic component is less than about 1 wt %. In another embodiment the amount of thermochromic component is less than about 0.5 wt %. In another embodiment the amount of thermochromic component is less than about 0.2 wt %. In another embodiment the amount of thermochromic component is less than about 0.1 wt %. In another embodiment the amount of thermochromic component is about 0.1 wt %. In another embodiment, the amount of thermochromic component is about 0.024 wt %.

In another embodiment, the amount of thermochromic component is present in an amount from about 0.005 wt % to about 5 wt % of the liquid radiation curable resin. In another embodiment, the amount of thermochromic component is present in an amount from about 0.005 wt % to about 3 wt %. In another embodiment, the amount of thermochromic component is present in an amount from about 0.005 wt % to about 2 wt %. In another embodiment, the amount of thermochromic component is present in an amount from about 0.005 wt % to about 1 wt %. In another embodiment, the amount of thermochromic component is present in an amount from about 0.01 wt % to about 5 wt %. In another embodiment, the amount of thermochromic component is present in an amount from about 0.05 wt % to about 5 wt %. In another embodiment, the amount of thermochromic component is present in an amount from about 0.01 wt % to about 2 wt %.

Thermolock® 79s Pink to Clear changes from a first color to no color when subjected to a certain increase in temperature. The activation temperature of Thermolock® 79s Pink to Clear is about 65° C. and the locking temperature is about 79° C. Once the locking temperature is reached, the color change can be reversed by lowering the temperature to about −10° C. In an embodiment, a thermochromic component that irreversibly changes color is used. In another embodiment, the thermochromic component that is incorporated into the liquid radiation curable resin is capable of changing from a first color to a second color due to a certain increase in temperature. In another embodiment, the thermochromic component is capable of changing from no color to a first color due to a certain increase in temperature.

Figure 2:

In an embodiment, Thermolock® 79s Pink to Clear is combined with commercially available Somos® WaterClear® Ultra 10122 liquid radiation curable resin. In another embodiment, Thermolock® 79s Pink to Clear is combined with commercially available Somos® WaterShed® XC 11122 liquid radiation curable resin. In another embodiment, Thermolock® 79s Pink to Clear is combined with a filled liquid radiation curable resin. Filled resins are liquid radiation curable resins that comprise a substantial amount of filler and are usually opaque or substantially opaque after cure. In an embodiment, Thermolock® 79s Pink to Clear is present in an amount less than about 5 wt % of the liquid radiation curable resin composition. In another embodiment the amount of Thermolock® 79s Pink to Clear is less than about 1 wt %. In another embodiment, the amount of Thermolock® 79s Pink to Clear is about 0.3 wt %. FIGS. 1 and 2 show cured three-dimensional articles produced from a liquid radiation curable resin composition of 99.7 wt % Somos® WaterShed® XC 11122 and 0.3 wt % Thermolock® 79s Pink to Clear.

In an embodiment, the thermochromic component is contained in Thermolock® 80s. Thermolock® 80s is a commercially available ink containing thermochromic components, filler, and other pigments. Thermolock® 80s is available from Matsui Shikiso Chemical Co. Ltd. and is the ink used in the Thermolock® Marker 80, also available from Matsui Shikiso Chemical Co. Ltd. Thermolock® 80s contains the same thermochromic components as Thermolock® 79s Pink to Clear, but also incorporates other pigments to effectuate a visible color change of red to yellow.

Thermolock® 80s can be incorporated into a liquid radiation curable resin. A commercially available Thermolock® Marker 80 can be obtained. The marker can then be disassembled by using, for example, a razorblade to disassemble the marker. The felt tip of the marker can then be removed and the ink extracted. The ink can then be poured into a liquid radiation curable resin. More than one Thermolock® Marker 80 may be needed depending on the batch size. The liquid radiation curable resin and Thermolock® 80s can then be combined by mixing.

In an embodiment, Thermolock® 80s is combined with commercially available Somos® WaterClear® Ultra 10122 liquid radiation curable resin. In another embodiment, Thermolock® 80s is combined with commercially available Somos® WaterShed® XC 11122 liquid radiation curable resin. Somos® WaterClear® Ultra 10122 liquid radiation curable resin and Somos® WaterShed® XC 11122 liquid radiation curable resin are substantially transparent after full cure. In another embodiment, Thermolock® 80s is combined with a filled liquid radiation curable resin. In an embodiment, Thermolock® 80s is present in an amount less than about 5 wt % of the liquid radiation curable resin composition. In another embodiment the amount of Thermolock® 80s is less than about 1 wt %. In another embodiment, the amount of Thermolock® 80s is about 0.3 wt %.

In another embodiment, the liquid radiation curable resin comprises at least one thermally sensitive transparency modifier, which may also be a thermochromic component. The thermally sensitive transparency modifier may operate by modifying how light passes through the three-dimensional article. This light scattering effect causes the article to become opaque or substantially opaque in certain sections. If the three-dimensional article is clear and colorless in sections where the thermally sensitive transparency modifier is not activated, the article may appear to be white in sections where the transparency has been modified. This is because the modification to the transparency causes light to reflect back at the viewer, thus producing the white color. The reduction in transparency can be controlled depending on the amount of thermally sensitive opacity modifier incorporated into the liquid radiation curable resin, or the local temperature of the liquid radiation curable resin.

In an embodiment, the thermally sensitive transparency modifier is a thermally expandable microsphere present in an amount from about 0.005 wt % to about 5 wt %. When the activation temperature of the thermally expandable microsphere is reached, the thermally expandable microsphere expands. The expansion causes the scattering of light passing through the three-dimensional article and creates an increasingly opaque appearance in the three-dimensional article. This opaque appearance can be selectively controlled by controlling the local temperature of the liquid radiation curable resin as it is being cured.

In an embodiment, the thermally sensitive transparency modifier is a thermally expandable microsphere. In an embodiment, the thermally expandable microsphere is in the form of an Expancel® unexpanded microsphere product produced by AkzoNobel NV. Please see http://www.ak-zonobel.com/expancel/. Detailed descriptions of various expandable microspheres and their production can be found in, for example, U.S. Pat. Nos. 3,615,972, 3,945,956, 4,287,308, 5,536,756, 6,235,800, 6,235,394 and 6,509,384, in EP 486080, EP 1054034, EP 1288272 and EP1408097, in WO 2004/072160, and in Japanese publication laid open No. 1987-286534. In an embodiment, the thermally expandable microsphere is a dry unexpanded microsphere. In an embodiment, the thermally sensitive transparency modifier is Expancel® 031 DU 40. In another embodiment, the thermally sensitive transparency modifier is Expancel® 820 DU 40. The activation and locking temperatures are the same for the Expancel® line of expandable microspheres. The activation and locking temperatures for Expancel® 031 DU 40 and Expancel® 820 DU 40 is approximately 75° C., with a maximum activation and locking temperature of approximately 115° C. In another embodiment, the thermally sensitive transparency modifier is Expance® 551 DU 40. The activation and locking temperatures for Expancel® 551 DU 40 is approximately 95-100° C., with a maximum activation and locking temperature of approximately 139-147° C.

Thermally expandable microspheres have previously been used in liquid radiation curable resins used in three-dimensional object formation. Please see Japanese Patent Application laid open 2-116537. The use of thermally expandable microspheres has previously been used to control warping or shrinkage as the three-dimensional object is formed. This Japanese patent application discusses the use of thermally expandable microspheres in a liquid radiation curable resin and discusses adding thermal energy to the resin during curing in order to initiate the appropriate amount of expansion. No discussion is made as to only initiating expansion of the thermally expandable microspheres in certain areas or to selectively control the expansion of the microspheres in certain locations so as to produce the visual effect of a selectively transparent article. Likewise, the control of the local temperature of the liquid radiation curable resin during polymerization so as to only initiate thermal expansion in certain areas of the cured three-dimensional object is not mentioned. The use of collapsible microspheres is also known in liquid radiation curable resins in order to control the effects of temperature on the three-dimensional object in investment casting applications. Please see, for example, U.S. Pat. Nos. 5,176,188 and 5,364,889, both assigned to DSM IP Assets BV.

The amount of thermally sensitive transparency modifier incorporated into a liquid radiation curable resin is dependent on the size of the microspheres. With smaller microspheres, a greater amount of thermally sensitive transparency modifier must be included to effectuate the selective change in transparency. In an embodiment, the thermally sensitive transparency modifier is present in an amount less than about 5 wt % of the liquid radiation curable resin composition. In another embodiment the amount of thermally sensitive transparency modifier is less than about 1 wt %. In another embodiment, the amount of thermally sensitive transparency modifier is about 0.5 wt %. In another embodiment, the amount of thermally sensitive transparency modifier is less than about 0.5 wt %. In another embodiment, the amount of thermally sensitive transparency modifier is about 0.1 wt %. In another embodiment, the amount of thermally sensitive transparency modifier is from about 0.005 to about 0.25 wt %.

In another embodiment, the amount of thermally sensitive transparency modifier is present in an amount from about 0.005 wt % to about 5 wt %. In another embodiment, the amount of thermally sensitive transparency modifier is present in an amount from about 0.005 wt % to about 3 wt %. In another embodiment, the amount of thermally sensitive transparency modifier is present in an amount from about 0.005 wt % to about 2 wt %. In another embodiment, the amount of thermally sensitive transparency modifier is present in an amount from about 0.005 wt % to about 1 wt %. In another embodiment, the amount of thermally sensitive transparency modifier is present in an amount from about 0.01 wt % to about 5 wt %. In another embodiment, the amount of thermally sensitive transparency modifier is present in an amount from about 0.05 wt % to about 5 wt %. In another embodiment, the amount of thermally sensitive transparency modifier is present in an amount from about 0.01 wt % to about 2 wt %.

Figure 3:
Figure 4:
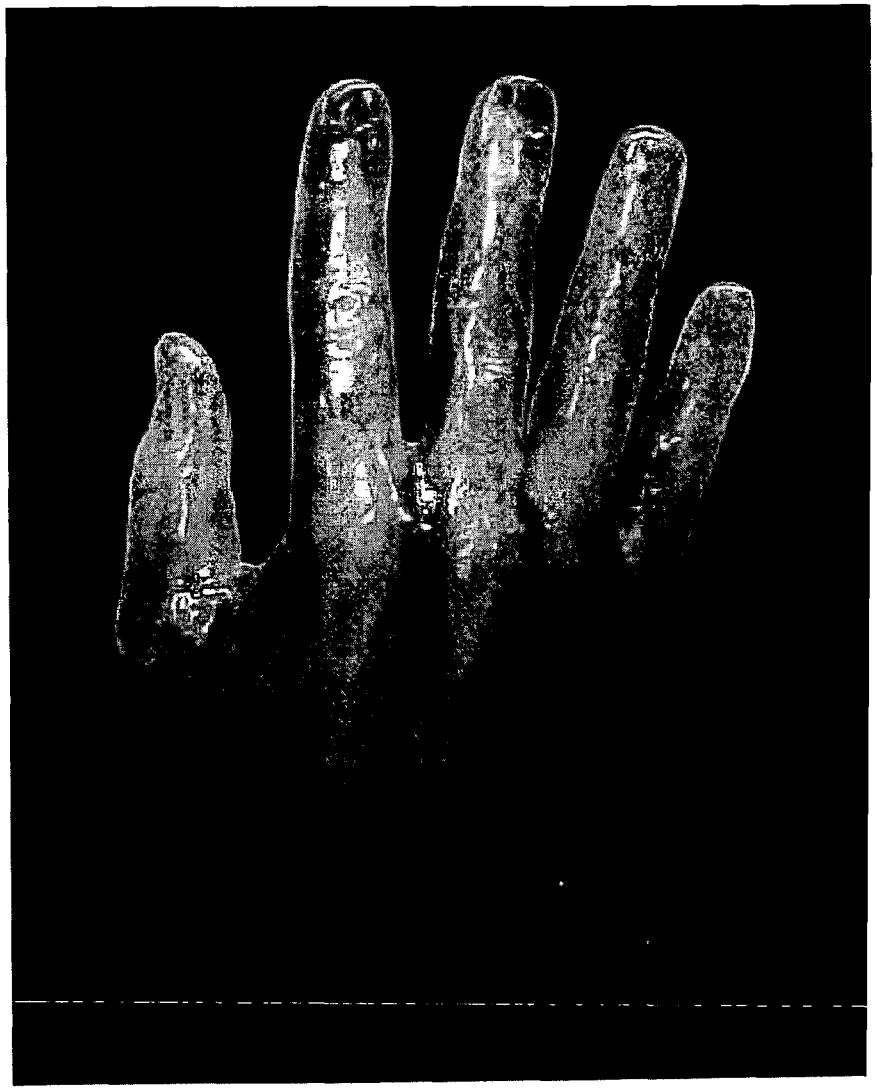

In an embodiment, the thermally sensitive transparency modifier is incorporated into a substantially clear liquid radiation curable resin. In another embodiment, the thermally sensitive transparency modifier is incorporated into a substantially clear and colorless liquid radiation curable resin. FIG. 3 and FIG. 4 show two example compositions wherein a thermally sensitive transparency modifier has been incorporated into a substantially clear and colorless liquid radiation curable resin. In both FIG. 3 and FIG. 4, the liquid radiation curable resin used to cure the pictured three-dimensional objects comprises approximately 0.1 wt % of Expancel 031 DU 40 and approximately 99.9 wt % of Somos® WaterClear® Ultra 10122. In FIG. 3, the white appearance of the teeth is created by achieving the activation temperature of the thermally sensitive transparency modifier in those regions. Similarly, in FIG. 4 the white appearance of the bones in the hand is created by achieving the activation temperature of the thermally sensitive transparency modifier in those regions.

In another embodiment, more than one thermally sensitive visual effect initiator is incorporated into the liquid radiation curable resin composition. In one embodiment, each of the more than one thermally sensitive visual effect initiators has the same activation and/or locking temperature. In another embodiment, at least one of the more than one thermally sensitive visual effect initiator has an activation temperature and/or a locking temperature which is different than the other thermally sensitive visual effect initiator or initiators. In this embodiment, additional colors and/or transparencies are achieved by controlling the temperature of the resin to activate color and/or transparency change, add color and/or opacity, or remove color and/or opacity in only some of the thermally sensitive visual effect initiator(s) in some areas while activating color and/or transparency change, adding color and/or opacity, or removing color and/or opacity in all or none of the thermally sensitive visual effect initiator(s) in other areas. The color and/or transparency of the liquid radiation curable resin before cure may or may not be the same as any part of the cured three-dimensional article.

In accordance with an embodiment of the invention, the liquid radiation curable resin comprises a thermally sensitive visual effect initiator, a free radical polymerizable component, and a photoinitiating system capable of initiating free radical polymerization. In another embodiment, the liquid radiation curable resin comprises a thermally sensitive visual effect initiator, a cationic polymerizable component, and a photoinitiating system capable of initiating cationic polymerization. In a further embodiment, the liquid radiation curable resin comprises a thermally sensitive visual effect initiator, a free radical polymerizable component, a photoinitiating system capable of initiating free radical polymerization, a cationic polymerizable component, and a photoinitiating system capable of initiating cationic polymerization.

In accordance with an embodiment of the invention, the liquid radiation curable resin of the invention may comprise at least one free-radical polymerizable component, that is, a component which undergoes polymerization initiated by free radicals. The free-radical polymerizable components are monomers, oligomers, and/or polymers; they are mono- functional or polyfunctional materials, i.e., have 1, 2, 3, 4, 5, 6, 7, 8, 9, 10, 20, 30, 40, 50, 100, or more functional groups that can polymerize by free radical initiation, may contain aliphatic, aromatic, cycloaliphatic, arylaliphatic, heterocyclic moiety(ies), or any combination thereof. Examples of polyfunctional materials include dendritic polymers such as dendrimers, linear dendritic polymers, dendrigraft polymers, hyperhranched polymers, star branched polymers, and hypergraft polymers; see US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl (meth) acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth) acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth) acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth) acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth) acrylate, undecyl (meth)acrylate, lauryl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, polyethylene glycol mono (meth)acrylate, polypropylene glycol mono (meth)acrylate, methoxyethylene glycol (meth)acrylate, ethoxyethyl (meth) acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, dimethylaminoethyl (meth) acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth) acrylate.

Examples of polyfunctional free-radical polymerizable components include those with (meth)acryloyl groups such as trimethylolpropane tri(meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro [5.5]undecane di(meth)acrylate; dipentaerythritol monohydroxypenta(meth)acrylate, propoxylated trimethylolpropane tri(meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri (meth)acrylate, tris(2-hydroxyethyl)isocyanurate di(meth) acrylate, pentaerythritol tri(meth)acrylate, pentaerythritol tetra(meth)acrylate, dipentaerythritol hexa(meth)crylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the polyfunctional (meth)acrylates of the polyfunctional component may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate, dipentaerythritol monohydroxypenta(meth)acrylate, dipentaerythritol hexa(meth)crylate, propoxylated trimethylolpropane tri(meth)acrylate, and propoxylated neopentyl glycol di(meth)acrylate, and any combination thereof.

In another embodiment, the free-radical polymerizable component is selected from the group consisting of bisphenol A diglycidyl ether diacrylate, dicyclopentadiene dimethanol diacrylate, [2-[1,1-dimethyl-2-[(1-oxoallyl)oxy] ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof.

In specific embodiments, the liquid radiation curable resin compositions of the invention include one or more of bisphenol A diglycidyl ether di(meth)acrylate, dicyclopentadiene dimethanol di(meth)acrylate, dipentaerythritol monohydroxypenta(meth)acrylate, propoxylated trimethylolpropane tri(meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol monohydroxypentaacrylate, propoxylated trimethylolpropane triacrylate, and/or propoxylated neopentyl glycol diacrylate.

The liquid radiation curable resin composition can include any suitable amount of the free-radical polymerizable component, for example, in certain embodiments, in an amount up to about 95% by weight of the composition, in certain embodiments, up to about 50% by weight of the composition, and in further embodiments from about 5% to about 25% by weight of the composition.

In all embodiments, the liquid radiation curable resin composition of the present invention includes a photoinitiating system. The photoinitiating system can be a free-radical photoinitiator or a cationic photoinitiator or a photoinitiator that contains both free-radical initiating function and cationic initiating functions on the same molecule. The photoinitiator is a compound that chemically changes due to the action of light or the synergy between the action of light and the electronic excitation of a sensitizing dye to produce at least one of a radical, an acid, and a base.

Typically, free radical photoinitiators are divided into those that form radicals by cleavage, known as "Norrish Type I" and those that form radicals by hydrogen abstraction, known as "Norrish type II". The Norrish type II photoinitiators require a hydrogen donor, which serves as the free radical source. As the initiation is based on a bimolecular reaction, the Norrish type II photoinitiators are generally slower than Norrish type I photoinitiators which are based on the unimolecular formation of radicals. On the other hand, Norrish type II photoinitiators possess better optical absorption properties in the near-UV spectroscopic region. Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a liquid radiation curable resin composition, it is necessary to review the wavelength sensitivity of the photoinitiator(s) present in the composition to determine if they will be activated by the method and wavelength of irradiation chosen to cure the composition.

In accordance with an embodiment, the liquid radiation curable resin composition includes at least one free radical photoinitiator, e.g., those selected from the group consisting of benzoylphosphine oxides, aryl ketones, benzophenones, hydroxylated ketones, 1-hydroxyphenyl ketones, ketals, metallocenes, and any combination thereof.

In an embodiment, the liquid radiation curable resin composition includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl)phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, bis(diethylamino)benzophenone, and 4,4'-bis(N,N'-dimethylamino)benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxy)phenyl]-2-methyl-1-propanone, 4-isopropylphenyl(1-hydroxyisopropyl)ketone, oligo-[2-hydroxy-2-methyl-1-[4-(1-methylvinyl)phenyl] propanone], camphorquinone, 4,4'-bis(diethylamino)benzophenone, benzil dimethyl ketal, bis(eta 5-2-4-cyclopentadien-1-yl)bis[2,6-difluoro-3-(1H-pyrrol-1-yl)phenyl] titanium, and any combination thereof.

For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl) phenyl-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino)benzophenone (Chivacure EMK from Chitec), and 4,4'-bis(N,N-dimethylamino)benzophenone (Michler's ketone). Also suitable are mixtures thereof.

Additionally, photosensitizers are useful in conjunction with photoinitiators in effecting cure with light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino)benzophenone (Chivacure EMK from Chitec).

It is possible for UV light sources to be designed to emit light at shorter wavelengths. For light sources emitting at wavelengths from between about 100 and about 300 nm, it is desirable to employ a photosensitizer with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, and dimethoxybenzophenone, and, 1-hydroxyphenyl ketones, such as 1-hydroxycyclohexyl phenyl ketone, phenyl (1-hydroxyisopropyl)ketone, 2-hydroxy-1-[4-(2-hroxyethoxy)phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl] propanone] (Esacure KIP 150 from Lamberti).

Light sources can also be designed to emit visible light. For light sources emitting light at wavelengths from about 475 nm to about 900 nm, examples of suitable free radical photoinitiators include: camphorquinone, 4,4'-bis(diethylamino)benzophenone (Chivacure EMK from Chitec), 4,4'-bis(N,N'-dimethylamino)benzophenone (Michler's ketone), bis(2,4,6-trimethylbenzoyl)-phenylphosphineoxide (Irgacure 819 or BAPO from Ciba), metallocenes such as bis(eta 5-2-4-cyclopentadien-1-yl)bis[2,6-difluoro-3-(1H-pyrrol-1-yl)phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

The liquid radiation curable resin composition can include any suitable amount of the free-radical photoinitiator, for example, in certain embodiments, in an amount up to about 15% by weight of the composition, in certain embodiments, up to about 10% by weight of the composition, and in further embodiments from about 1% to about 5% by weight of the composition. In other embodiments, the amount of free-radical photoinitiator is present in an amount of from about 1 wt % to about 8 wt % of the total composition, more preferably from about 1 wt % to about 6 wt % of the total composition.

In accordance with an embodiment, liquid radiation curable resin compositions of the invention comprise at least one cationically polymerizable component, that is, a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Examples of cationically polymerizable components include cyclic ether compounds such as epoxy compounds and oxetanes, cyclic lactone compounds, cyclic acetal compounds, cyclic thioether compounds, Spiro orthoester compounds, and vinylether compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexcylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —SO$_2$—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)—, dicyclopentadiene diepoxide, di(3,4-epoxycyclohexylmethyl)ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, polyglycidyl ethers of polyether polyol obtained by the addition of one or more alkylene oxides to aliphatic polyhydric alcohols such as ethylene glycol, propylene glycol, and glycerol, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(3-hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl)ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, (3-ethyl-3-oxetanylmethoxy)methyl benzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene (3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, and any combination thereof. Examples of polyfunctional materials that are cationically polymerizable include dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In embodiments of the invention, the cationic polymerizable component is at least one selected from the group consisting of a cycloaliphatic epoxy and an oxetane. In a specific embodiment, the cationic polymerizable component is an oxetane, for example, an oxetane containing 2 or more than 2 oxetane groups. In another specific embodiment, the cationic polymerizable component is a cycloaliphatic epoxy, for example, a cycloaliphatic epoxy with 2 or more than 2 epoxy groups.

In an embodiment, the epoxide is 3,4-epoxycyclohexylmethyl-3',4-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPONEX™ 1510 from Hexion), 1,4-cyclohexanedimethanol diglycidyl ether (available as HELOXY™ 107 from Hexion), a mixture of dicyclohexyl diepoxide and nanosilica (available as NANOPDX™), and any combination thereof.

The above-mentioned cationically polymerizable compounds can be used singly or in combination of two or more thereof.

The liquid radiation curable resin composition can include any suitable amount of the cationic polymerizable component, for example, in certain embodiments, in an amount an amount up to about 95% by weight of the composition, in certain embodiments, up to about 50% by weight of the composition, and in further embodiments from about 5% to about 25% by weight of the composition. In other embodiments the amount of cationically polymerizable components if from about 10 wt % to about 80 wt % of the total composition.

In accordance with an embodiment, the polymerizable component of the liquid radiation curable resin composition is polymerizable by both free-radical polymerization and cationic polymerization. An example of such a polymerizable component is a vinyloxy compound, for example, one selected from the group consisting of bis(4-vinyloxybutyl)isophthalate, tris(4-vinyloxybutyl)trimellitate, and combinations thereof.

In accordance with an embodiment, the liquid radiation curable resin composition includes a photoinitiating system that is a photoinitiator having both cationic initiating function and free radical initiating function. In accordance with an embodiment, the liquid radiation curable resin composition includes a cationic photoinitiator. The cationic photoinitiator generates photoacids upon irradiation of light. They generate Brönsted or Lewis acids upon irradiation.

The cationic photoinitiator triaryl sulfonium tetrakis(pentafluorophenyl)borate is available from Bayer/Ciba. Triaryl sulfonium tetrakis(pentafluorophenyl)borate can be used either as the only cationic photoinitiator present in the photocurable composition or in combination with other cationic photoinitiators. In an embodiment, triaryl sulfonium tetrakis(pentafluorophenyl)borate is used in combination with sulfonium antimonate type photoinitiators.

In an embodiment, any suitable cationic photoinitiator can be used, for example, those selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, sulfonium antimonate salts, ferrocenes, di(cyclopentadienyliron)arene salt compounds, cyclohexeneoxide compounds, and pyridinium salts, and any combination thereof. Onium salts, e.g., iodonium salts, sulfonium salts and ferrocenes, have the advantage that they are thermally stable. Thus, any residual photoinitiator does not continue to cure after the removal of the irradiating light. Cationic photoinitiators offer the advantage that they are not sensitive to oxygen present in the atmosphere.

The liquid radiation curable resin composition of the invention includes at least one cationic photoinitiator, wherein the cationic photoinitiator is selected from the group consisting of aromatic diazonium salts, aromatic sulfonium salts, aromatic iodonium salts, metallocene based compounds, aromatic phosphonium salts and silanol aluminium complexes, and any combination thereof. In an embodiment, the cationic photoinitiator is selected from the group consisting of aromatic sulfonium salts, aromatic iodonium salts, and metallocene based compounds, and any combination thereof. In another embodiment, the cationic photoinitiator is selected from the group consisting of triarylsulfonium salts, diaryliodonium salts, and metallocene based compounds, and any combination thereof.

In a particular embodiment, the cationic photoinitiator has an anion selected from the group consisting of $BF_4^-$, $AsF_6^-$, $SbF_6^-$, $PF_6^-$, $B(C_6F_5)_4^-$, perfluoroalkylsulfonates, perfluoroalkylphosphates, and carborane anions.

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, perfluoroalkylsulfonates, perfluoroalkylphosphates, and $(CH_6B_{11}Cl_6)^-$.

In a particular embodiment, the cationic photoinitiator is an aromatic sulfonium salt based cationic photoinitiator selected from the group consisting of 4-(4-benzoylphenylthio)phenyldiphenylsulfonium hexafluoroantimonate, 4-(4-benzoylphenylthio)phenylbis(4-hydroxyethyloxyphenyl)sulfonium hexafluoroantimonate, 4-(4-benzoylphenylthio)phenylbis(4-fluorophenyl)sulfonium hexafluoroantimonate, 4-(4-benzoylphenylthio)phenylbis(4-chlorophenyl)sulfonium hexafluoroantimonate, 4-[4(3-chlorobenzoyl)phenylthio]phenylbis(4-flourophenyl)sulfonium hexafluoroantimonate, 4-(4-benzoylphenylthio)phenylbis(4-methylphenyl)sulfonium hexafluoroantimonate, 4-(4-benzoylphenylthio)phenylbis(4-hydroxyethylphenyl)sulfonium hexafluoroantimonate, 4-[4-(4-hydroxyethyloxybenzoyl)phenylthio]phenylbis(4-fluorophenyl)sulfonium hexafluoroantimonate, 4-[4(4-hydroxyethyloxybenzoyl)phenylthio]phenyldiphenylsulfonium hexafluoroantimonate, 4-[4-(4-hydroxyethyloxybenzoyl)phenylthio]phenylbis(4-hydroxyethyloxyphenyl)sulfonium hexafluoroantimonate, 4-(4-benzoylphenylthio)phenylbis(4-methoxyethoxyphenyl)sulfonium hexafluoroantimonate, 4-[4-(3-methoxybenzoyl)phenylthiol]phenyldiphenylsulfonium hexafluoroantimonate, 4-[4-(3-methoxycarbonylbenzoyl)phenylthio]phenyldiphenylsulfonium hexafluoroantimonate, 4-[4-(2-hydroxymethylbenzoyl)phenylthio]benzyldiphenylsulfonium hexafluoroantimonate, 4-[4-(4-methylbenzoyl)phenylthio]phenylbis(4-fluorophenyl)sulfonium hexafluoroantimonate, 4-[4-(4-)phenylthio]phenylbis(4-fluorophenyl)sulfonium hexafluoroantimonate, 4-[4-(4-fluorobenzoyl)phenylthio]phenylbis(4-fluorophenyl)sulfonium hexafluoroantimonate, 4-[4-(2-methoxycarbonylbenzoyl)phenylthio]phenylbis(4-fluoro phenyl)sulfonium hexafluoroantimonate, bis[4-(diphenylsulfonio)phenyl]sulfide bishexafluorophosphate, bis[4-(diphenylsulfonio)phenyl]sulfide bistetralluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bistetrafluoroborate, and bis[4-(di(4-(2-hydroxyethoxy))phenylsulfonio)phenyl]sulfide tetrakis(pentafluorophenyl)borate, and any combination thereof.

In another embodiment, the cationic photoinitiator is an aromatic iodonium salt based cationic photoinitiator selected from the group consisting of diphenyliodonium hexafluorophosphate, diphenyliodonium hexafluoroantimonate, diphenyliodonium tetrafluoroborate, diphenyliodonium tetrakis(pentafluorophenyl)borate, bis(dodecylphenyl)iodonium hexafluorophosphate, bis(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate, and 4-methylphenyl-4-(1-methylethyl)phenyliodonium tetrakis(pentafluorophenyl)borate, and any combination thereof.

In certain embodiments, the cationic photoinitiator is selected from the group consisting of tetrakis(pentafluorophenyl)borate or hexafluoroantimonate salt of 4-(4-benzoylphenylthio)phenyldiphenylsulfonium, 4-(4-benzoylphenylthio)phenylbis(4-hydroxyethyloxyphenyl)sulfonium, 4-(4-benzoylphenylthio)phenylbis(4-fluorophenyl)sulfonium, 4-(4-benzoylphenylthio)phenylbis(4-chlorophenyl)sulfonium, 4-[4-(3-chlorobenzoyl)phenylthio]phenylbis(4-fluorophenyl)sulfonium, 4-[4-(2-chlorobenzoyl)phenylthio]phenylbis(4-fluorophenyl)sulfonium, (4-thiophenoxyphenyl)diphenylsulfonium, S,S,S',S"-tetraphenylthiobis(4,1-phenylene)disulfonium, triphenylsulfonium, (chlorophenyl)diphenylsulfonium, chloro[S-(phenyl)thianthrenium], S-(phenyl)thianthrenium, diphenyl-4-(4'-thiophenoxy)thiophenoxyphenylsulfonium, phenyldi(4-thiophenoxyphenyl)sulfonium, S-(4-thiophenoxyphenyl)thianthrenium, and (thiodi-4,1-phenylene)bis[bis[4-(2-hydroxyethoxy)phenyl]sulfonium, tris(4-(4-acetylphenyl)thiophenyl)sulfonium, bis(4-dodecylphenyl)iodonium, [4-[(2-hydroxytetradecyl)oxy]phenyl]phenyliodonium, (4-methylphenyl)[4-[[2-[[[[3-(trifluoromethyl)phenyl] amino]carbonyl]oxy]tetradecyl]oxy]phenyl]iodonium, bis (4-dodecylphenyl)iodonium, [4-(1-methylethyl)phenyl](4-methylphenyl)iodonium, and any combination thereof.

In an illustrative embodiment, the liquid radiation curable resin composition includes a cationic photoinitiator selected from the group consisting of triarylsulfonium SbF$_6^-$, triarylsulfonium borate, tris(4-(4-acetylphenyl)thiophenyl)sulfonium tetrakis(pentafluorophenyl)borate, diaryliodonium borate, iodonium[4-(1-methylethyl)phenyl](4-methylphenyl)-tetrakis(pentafluorophenyl)borate, and any combination thereof. A nonnucleophilic anion serves as the counterion. Examples of such anions include BF$_4^-$, AsF$_6^-$, PF$_6^-$, B(C$_6$F$_5$)$_4^-$, perfluoroalkylsulfonates, perfluoroalkylphosphates, and carborane anions such as (CH$_6$B$_{11}$Cl$_6$)$^-$.

Examples of cationic photoinitiators useful for curing at 300-475 nm, particularly at 365 nm UV light, without a sensitizer include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl)sulfonium tetrakis(pentafluorophenyl)borate, and tris(4-(4-acetylphenyl)thiophenyl)sulfonium tetrakis(pentafluorophenyl)borate.

In some embodiments it is desirable for the liquid radiation curable resin composition to include a photosensitizer. The term "photosensitizer" is used to refer to any substance that either increases the rate of photoinitiated polymerization or shifts the wavelength at which polymerization occurs; see textbook by G. Odian, Principles of Polymerization, 3$^{rd}$ Ed., 1991, page 222. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl-methanone, isopropyl-9H-thioxanthen-9-one, 1-pyrenemethanol, 9-(hydroxymethyl)anthracene, 9,10-diethoxyanthracene, 9,10-dimethoxyanthracene, 9,10-dipropoxyanthracene, 9,10-dibutyloxyanthracene, 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate, methyl-2-benzoyl benzoate, 4-benzoyl-4'-methyl diphenyl sulphide, 4,4'-bis(diethylamino)benzophenone, and any combination thereof.

Additionally, photosensitizers are useful in combination with photoinitiators in effecting cure with light sources emitting in the wavelength range of 300-475 nm. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino)benzophenone (Chivacure EMK from Chitec).

In an embodiment, the photosensitizer is a fluorone, e.g., 5,7-diiodo-3-butoxy-6-fluorone, 5,7-diiodo-3-hydroxy-6-fluorone, 9-cyano-5,7-diiodo-3-hydroxy-6-fluorone, or a photosensitizer is

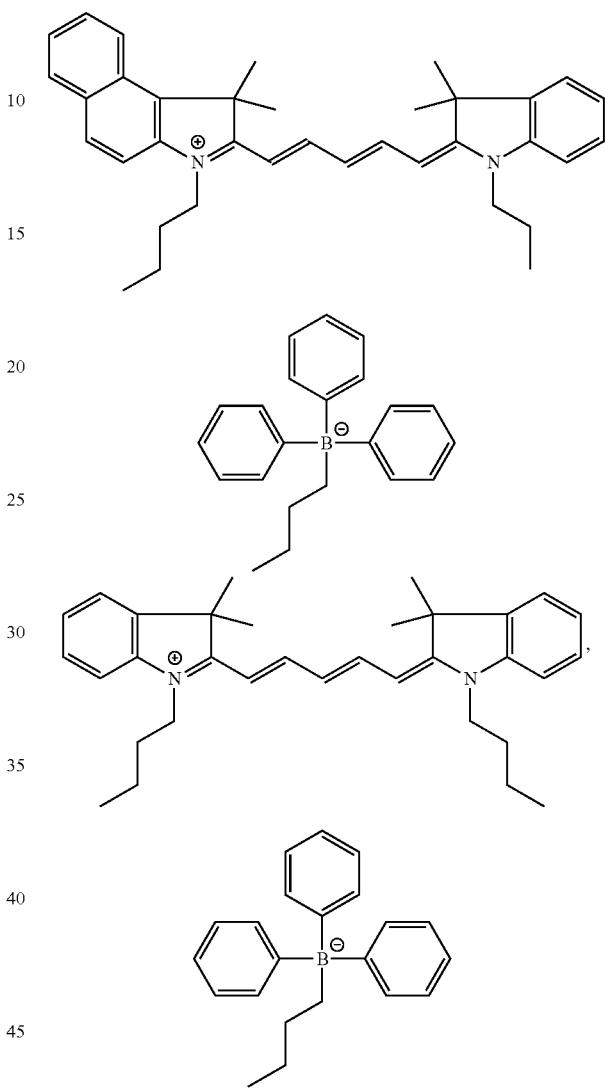

and any combination thereof.

The liquid radiation curable resin composition can include any suitable amount of the photosensitizer, for example, in certain embodiments, in an amount up to about 10% by weight of the composition, in certain embodiments, up to about 5% by weight of the composition, and in further embodiments from about 0.05% to about 2% by weight of the composition.

When photosensitizers are employed, other photoinitiators absorbing at shorter wavelengths can be used. Examples of such photoinitiators include: benzophenones, such as benzophenone, 4-methyl benzophenone, 2,4,6-trimethyl benzophenone, and dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hydroxyethoxy)phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl]propanone] (Esacure KIP 150 from Lamberti). These photoinitiators when used in combination with a photosensitizer are suitable for use with light sources emitting at wavelengths from about 100 nm to about 300 nm.

Light sources that emit visible light are also known. For light sources emitting light at wavelengths greater than about 400 nm, e.g., from about 475 nm to about 900 nm, examples of suitable photoinitiators include: camphorquinone, 4,4'-bis(diethylamino) benzophenone (Chivacure EMK from Chitec), 4,4'-bis(N,N-dimethylamino)benzophenone (Michler's ketone), bis(2,4,6-trimethylbenzoyl)-phenylphosphineoxide (Irgacure 819 or BAPO from Ciba), metallocenes such as bis(eta 5-2-4-cyclopentadien-1-yl)bis [2,6-difluoro-3-(1H-pyrrol-1-yl)phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

A photosensitizer or co-initiator may be used to improve the activity of the cationic photoinitiator. It is for either increasing the rate of photoinitiated polymerization or shifting the wavelength at which polymerization occurs. The sensitizer used in combination with the above-mentioned cationic photoinitiator is not particularly limited. A variety of compounds can be used as photosensitizers, including heterocyclic and fused-ring aromatic hydrocarbons, organic dyes, and aromatic ketones. Examples of sensitizers include compounds disclosed by J. V. Crivello in *Advances in Polymer Science*, 62, 1 (1984), and by J. V. Crivello & K. Dietliker, "Photoinitiators for Cationic Polymerization" in Chemistry & technology of UV & EB formulation for coatings, inks & paints. Volume III, Photoinitiators for free radical and cationic polymerization. by K. Dietliker; [Ed. by P. K. T, Oldring], SITA Technology Ltd, London, 1991. Specific examples include polyaromatic hydrocarbons and their derivatives such as anthracene, pyrene, perylene and their derivatives, thioxanthones, α-hydroxyalkylphenones, 4-benzoyl-4'-methyldiphenyl sulfide, acridine orange, and benzoflavin.

There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol, 3 (edited by P. K. T. Oldring).

Suitable ferrocene type cationic photoinitiators include, for example, di(cyclopentadienyliron)arene salt compounds of formula (I) as disclosed in Chinese Patent No. CN 101190931:

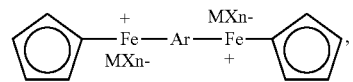

wherein anion MXn is selected from $BF_4$, PF6, SbF6, AsF6, $(C6F5)_4B$, ClO4, CF3SO3, FSO3, CH3SO3, C4F9SO3, and Ar is a fused ring or polycyclic arene.

Other illustrative ferrocene type cationic photoinitiators include, for example, (η6-Carbazole)(η5-cyclopenta-dienyl) iron hexafluorophosphate salts, specifically [cyclopentadiene-Fe-N-butylcarbazole]hexafluoro-phosphate (C4-CFS PF6) and [cyclopentadiene-Fe-N-octyl-carbazole] hexafluorophosphate (C8-CFS PF6), bearing C4 and C8 alkyl chains, respectively, on the nitrogen atom (see Polymer Eng. & Science (2009), 49(3), 613-618); ferrocenium dication salts, e.g., biphenyl bis[(π-cyclopentadienyl) iron] hexafluorophosphate ([bis(Cp-Fe)-biphenyl] (PF6)2) and straight cyclopentadien-iron-biphenyl hexafluorophosphate ([Cp-Fe-biphenyl]+PF6-) as disclosed in Chinese J. Chem. Engnrng (2008), 16(5), 819-822 and Polymer Bulltn (2005), 53(5-6), 323-331; cyclopentadienyl-Fe-carbazole hexafluorophosphate ([Cp-Fe-carbazole]-+PF6-), cyclopentadienyl-Fe-N-ethylcarbazole hexafluorophosphate ([Cp-Fe-n-ethylcarbazole]+PF6-) and cyclopentadienyl-Fe-aminonaphthalene hexafluorophosphate ([Cp-Fe-aminonaphthalene]+PF6-) as disclosed in J Photochem. & Photobiology, A: Chemistry (2007), 187(2-3), 389-394 and Polymer Intnl (2005), 54(9), 1251-1255; alkoxy-substituted ferrocenium salts, for example, [cyclopendadien-Fe-anisole] PF6, [cyclopendadien-Fe-anisole]BF4, [cyclopendadien-Fe-diphenylether]PF6, [cyclo-pendadien-Fe-diphenylether] BF4, and [cyclopendadien-Fe-diethoxy-benzene]PF6, as disclosed in Chinese J. of Chem Engnrng (2006), 14(6), 806-809; cyclopentadiene-iron-arene tetrafluoroborates, for example, cyclopentadiene-iron-naphthalene tetrafluoroborate ([Cp-Fe-Naph] BF4) salt, as disclosed in Imaging Science J (2003), 51(4), 247-253; ferrocenyl tetrafluoroborate ([Cp-Fe-CP]BF4), as disclosed in Ganguang Kexue Yu Guang Huaxue (2003), 21(1), 46-52; [CpFe(η6-tol)]BF4, as disclosed in Ganguang Kexue Yu Guang Huaxue (2002), 20(3), 177-184, Ferrocenium salts (η6-α-naphthoxybenzene) (η5-cyclopentadienyl) iron hexafluorophosphate (NOFC-1) and (η6-β-naphthoxybenzene) (η5-cyclopentadienyl) iron hexafluorophosphate (NOFC-2), as disclosed in Int. J. of Photoenergy (2009), Article ID 981065; (η6-Diphenyl-methane) (η5-cyclopentadienyl) iron hexafluorophosphate and (η6-benzophenone) (η5-cyclopenta-dienyl) iron hexafluorophosphate, as disclosed in Progress in Organic Coatings (2009), 65(2), 251-256; [CpFe(η6-isopropyl-benzene)]PF6, as disclosed in Chem Comm (1999), (17), 1631-1632; and any combination thereof.

Suitable onium type cationic photoinitiators include, for example, iodonium and sulfonium salts, as disclosed in Japanese Patent JP 2006151852. Other illustrative onium type photoinitiators include, for example, onium salts such as, diaryliodonium salts, triarylsulfonium salts, aryl-diazonium salts, ferrocenium salts, diarylsulfoxonium salts, diaryl-iodoxonium salts, triaryl-sulfoxonium salts, dialkyl-phenacyl-sulfonium salts, dialkylhydroxy-phenylsulfonium salts, phenacyl-triarylphosphonium salts, and phenacyl salts of heterocyclic nitrogen-containing compounds, as disclosed in U.S. Pat. Nos. 5,639,413; 5,705,116; 5,494,618; 6,593,388; and Chemistry of Materials (2002), 14(11), 4858-4866; aromatic sulfonium or iodonium salts as disclosed in U.S. Patent Application No. 2008/0292993; diaryl-, triaryl-, or dialkylphenacylsulfonium salts, as disclosed in US2008260960 and J. Poly Sci, Part A (2005), 43(21), 5217; diphenyl-iodonium hexafluorophosphate (Ph2I+ PF6-), as disclosed in Macromolecules (2008), 41(10). 3468-3471; onium salts using onium salts using less toxic anions to replace, e.g., SbF6-. Mentioned are anions: B(C6F5)4-, Ga(C6F5)4- and perfluoroalkyl fluorophosphate, PFnRf(6-n)-, as disclosed in Nettowaku Porima (2007), 28(3), 101-108; Photoactive allyl ammonium salt (BPEA) containing benzophenone moiety in the structure, as disclosed in Eur Polymer J (2002), 38(9), 1845-1850; 1-(4-Hydroxy-3-methylphenyl)tetrahydrothiophenium hexafluoroantimonate, as disclosed in Polymer (1997), 38(7), 1719-1723; and any combination thereof.

Illustrative iodonium type cationic photoinitiators include, for example, diaryliodonium salts having counterions like hexafluoro-phosphate and the like, such as, for example, (4-n-pentadecyloxy-phenyl)phenyliodonium hexa-fluoroantimonate, as disclosed in US2006041032; diphenyliodonium hexafluorophosphate, as disclosed in U.S. Pat. No. 4,394,403 and Macromolecules (2008), 41(2), 295-297; diphenyliodonium ions as disclosed in Polymer (1993), 34(2), 426-8; Diphenyliodonium salt with boron tetrafluoride (Ph2I+ BF4-), as disclosed in Yingyong Huaxue (1990), 7(3), 54-56; SR-1012, a diaryldiodonium salt, as disclosed in Nuclear Inst. & Methods in Physics Res, B (2007), 264(2), 318-322; diaryliodonium salts, e.g., 4,4'-di-tert-butyldiphenyl-iodonium hexafluoroarsenate, as disclosed in J Polymr Sci, Polymr Chem Edition (1978), 16(10), 2441-2451; Diaryliodonium salts containing complex metal halide anions such as diphenyliodonium fluoroborate, as disclosed in J Polymr Sci, Poly Sympos (1976), 56, 383-95; and any combination thereof.

Illustrative sulfonium type cationic photoinitiators include, for example, UVI 6992 (sulfonium salt) as disclosed in Japanese patent JP2007126612; compounds of the formula:

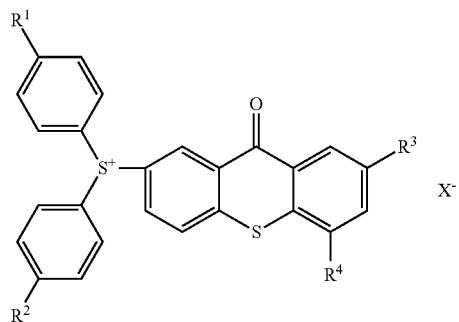

where R1-2=F; R3=isopropyl; R4=H; X=PF6, as disclosed in Japanese patent JP10101718; thioxanthone-based sulfonium salts, e.g., of the formula:

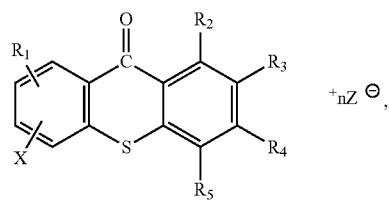

as disclosed in U.S. Pat. No. 6,054,501; (Acyloxyphenyl)sulfonium salts of the type $R_3-xS+R3x$ A-, where A- is a non-nucleophilic anion such as $AsF_6-$, and R3 may be the phenyl group shown below:

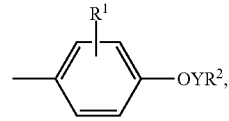

as disclosed in U.S. Pat. No. 5,159,088; 9,10-dithiophenoxyanthracene alkyldiarylsulfonium salts, e.g., ethylphenyl (9-thiophenoxy-anthracenyl-10) sulfonium hexafluoroantimonate, and the like, as disclosed in U.S. Pat. No. 4,760,013; etc.; triphenylsulfonium hexafluorophosphate salt, as disclosed in U.S. Pat. No. 4,245,029; S,S-dimethyl-S-(3,5-dimethyl-2-hydroxyphenyl)sulfonium salts, as disclosed in J Poly Sci, Part A (2003), 41(16), 2570-2587; Anthracene-bound sulfonium salts, as disclosed in J Photochem & Photobiology, A: Chemistry (2003), 159(2), 161-171; triarylsulfonium salts, as disclosed in J Photopolymer Science & Tech (2000), 13(1), 117-118 and J Poly Science, Part A (2008), 46(11), 3820-29; S-aryl-S,S-cycloalkylsulfonium salts, as disclosed in J Macromol Sci, Part A (2006), 43(9), 1339-1353; dialkylphenacylsulfonium salts, as disclosed in UV & E13 Tech Expo & Conf, May 2-5, 2004, 55-69 and ACS Symp Ser (2003), 847, 219-230; Dialkyl(4-hydroxyphenyl)sulfonium salts, and their isomeric dialkyl(2-hydroxyphenyl)sulfonium salts, as disclosed in ACS 224th Natnl Meeting, Aug. 18-22, 2002, POLY-726; Dodecyl(4-hydroxy-3,5-dimethylphenyl)methylsulfonium hexafluorophosphate and similar alkyl analogs other than dodecyl. Tetrahydro-1-(4-hydroxy-3,5-dimethylphenyl)thiophenium hexafluorophosphate and tetrahydro-1-(2-hydroxy-3,5-dimethylphenyl)thiophenium hexafluorophosphate, as disclosed in ACS Polymer Preprints (2002), 43(2), 918-919; photoinitiators with the general structure Ar'S+CH3(C12H-25) SbF6-, where Ar' is phenacyl (1), 2-indanonyl (II), 4-methoxyphenacyl (III), 2-naphthoylmethyl (TV), 1-anthroylmethyl (V), or 1-pyrenoylmethyl (VI), as disclosed in J Polymr Sci, Part A (2000), 38(9), 1433-1442; Triarylsulfonium salts Ar3S+MXn- with complex metal halide anions such as BF4-, AsF6-, PF6-, and SbF6-, as disclosed in J Polymr Sci, Part A (1996), 34(16), 3231-3253; Dialkylphenacylsulfonium and dialkyl(4-hydroxyphenyl)sulfonium salts, as disclosed in Macromolecules (1981), 14(5), 1141-1147; Triarylsulfonium salts R2R1S+MFn- (R, R1=Ph or substituted phenyl; M=B, As, P; n=4 or 6) and the sulfonium salt of formula (I):

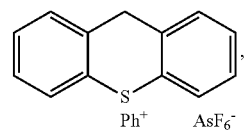

as disclosed in J. Polymr. Sci, Polymr Chem Edition (1979), 17(4), 977-99; aromatic sulfonium salts with, e.g., PF6- anion, e.g., UVI 6970, as disclosed in JP 2000239648; and any combination thereof Suitable pyridinium type cationic photoinitiators include, for example, N-ethoxy 2-methylpyridinium hexafluorophosphate (EMP+ PF6-), as disclosed in Turkish J of Chemistry (1993), 17(1), 44-49; Charge-transfer complexes of pyridinium salts and aromatic electron donors (hexamethylbenzene and 1,2,4-trimethyoxy-benzene), as disclosed in Polymer (1994), 35(11), 2428-31; N,N'-diethoxy-4,4'-azobis (pyridinium) hexafluorophosphate (DEAF), as disclosed in Macromolecular Rapid Comm (2008), 29(11), 892-896; and any combination thereof.

Other suitable cationic photoinitiators include, for example, Acylgermane based photoinitiator in the presence of onium salts, e.g., benzoyltrimethylgermane (BTG) and onium salts, such as diphenyl-iodonium hexafluorophosphate (Ph2I+PF6-) or N-ethoxy-2-methyl-pyridinium hexafluorophosphate (EMP+PF6-), as disclosed in Macromolecules (2008), 41(18), 6714-6718; Di-Ph diselenide (DPDS), as disclosed in Macromolecular Symposia (2006), 240, 186-193; N-phenacyl-N,N-dimethyl-anilinium hexafluoroantimonate (PDA+SbF6-), as disclosed in Macromol Rapid Comm (2002), 23(9), 567-570; Synergistic blends of: diaryliodonium hexafluoro-antimonate (IA) with tolylcumyl-iodonium tetrakis(pentafluoro-phenyl)borate (IB), and cumenecyclopentadienyliron(II) hexafluorophosphate with IA and IB, as disclosed in Designed Monomers and Polymers (2007), 10(4), 327-345; Diazonium salts, e.g., 4-(hexyloxy)-substituted diazonium salts with complex anions, as disclosed in ACS Symp Series (2003), 847, 202-212; 5-Arylthianthrenium salts, as disclosed in J Poly Sci, Part A (2002), 40(20), 3465-3480; and any combination thereof.

Other suitable cationic photoinitiators include, for example, triarylsulfonium salts such as triarylsulfonium borates modified for absorbing long wavelength UV. Illustrative examples of such modified borates include, for example, SP-300 available from Denka, tris(4-(4-acetylphenyl)thiophenyl)sulfonium tetrakis(pentafluorophenyl)borate (GSID4480-1 or Irgacure PAG-290) available from Ciba/BASF, and those photoinitiators disclosed in WO1999028295; WO2004029037; WO2009057600; U.S. Pat. No. 6,368,769 WO2009047105; WO2009047151; WO2009047152; US 20090208872; and U.S. Pat. No. 7,611,817.

Preferred cationic photoinitiators include a mixture of: bis[4-diphenylsulfoniumphenyl]sulfide bishexafluoroantimonate; thiophenoxyphenylsulfonium hexafluoroantimonate (available as Chivacure 1176 from Chitec); tris(4-(4-acetylphenyl)thiophenyl)sulfonium tetrakis (pentafluorophenyl)borate (GSID4480-1 from Ciba/BASF), iodonium, [4-(1-methylethyl)phenyl](4-methylphenyl)-, tetrakis(pentafluorophenyl)borate (available as Rhodorsil 2074 from Rhodia), 4-[4-(2-chlorobenzoyl)phenylthio]phenylbis (4-fluorophenyl)sulfonium hexafluoroantimonate (as SP-172) and SP-300 (both available from Adeka).

The liquid radiation curable resin composition can include any suitable amount of the cationic photoinitiator, for example, in certain embodiments, in an amount an amount up to about 50% by weight of the composition, in certain embodiments, up to about 20% by weight of the composition, and in further embodiments from about 1% to about 10% by weight of the composition. In a further embodiment, the amount of cationic photoinitiator is from about 0.25 wt % to about 8 wt % of the total composition, more preferably from about 1 wt % to about 6 wt %. In an embodiment, the above ranges are particularly suitable for use with epoxy monomers.

In accordance with an embodiment, the liquid radiation curable resin composition can further include a chain transfer agent, particularly a chain transfer agent for a cationic monomer. The chain transfer agent has a functional group containing active hydrogen. Examples of the active hydrogen-containing functional group include an amino group, an amide group, a hydroxyl group, a sulfo group, and a thiol group. In an embodiment, the chain transfer agent terminates the propagation of one type of polymerization, i.e., either cationic polymerization or free-radical polymerization and initiates a different type of polymerization, i.e., either free-radical polymerization or cationic polymerization. In accordance with an embodiment, chain transfer to a different monomer is a preferred mechanism. In embodiments, chain transfer tends to produce branched molecules or crosslinked molecules. Thus, chain transfer offers a way of controlling the molecular weight distribution, crosslink density, thermal properties, and/or mechanical properties of the cured resin composition.

Any suitable chain transfer agent can be employed. For example, the chain transfer agent for a cationic polymerizable component is a hydroxyl-containing compound, such as a compound containing 2 or more than 2 hydroxyl-groups. In an embodiment, the chain transfer agent is selected from the group consisting of a polyether polyol, polyester polyol, polycarbonate polyol, ethoxylated or propoxylated aliphatic or aromatic compounds having hydroxyl groups, dendritic polyols, hyperbranched polyols. An example of a polyether polyol is a polyether polyol comprising an alkoxy ether group of the formula $[(CH_2)_nO]_m$, wherein n can be 1 to 6 and m can be 1 to 100.

A particular example of a chain transfer agent is polytetrahydrofuran such as TERATHANE™.

The liquid radiation curable resin composition can include any suitable amount of the chain transfer agent, for example, in certain embodiments, in an amount up to about 50% by weight of the composition, in certain embodiments, up to about 30% by weight of the composition, and in certain other embodiments from about 10% to about 20% by weight of the composition.

The liquid radiation curable resin composition of the invention can further include one or more additives selected from the group consisting of bubble breakers, antioxidants, surfactants, acid scavengers, pigments, dyes, thickeners, flame retardants, silane coupling agents, ultraviolet absorbers, resin particles, core-shell particle impact modifiers, soluble polymers and block polymers, organic, inorganic, or organic-inorganic hybrid fillers of sizes ranging from 8 nanometers to about 50 microns.

Stabilizers are often added to the compositions in order to prevent a viscosity build-up, for instance a viscosity build-up during usage in a solid imaging process. In an embodiment, stabilizers include those described in U.S. Pat. No. 5,665,792, the entire disclosure of which is hereby incorporated by reference. Such stabilizers are usually hydrocarbon carboxylic acid salts of group IA and IIA metals. In other embodiments, these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers include polyvinylpyrrolidones and polyacrylonitriles. Other possible additives include dyes, pigments, fillers (e.g. silica particles—preferably cylindrical or spherical silica particles—, talc, glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, titanium oxide, aluminum powder, bronze powder, zinc powder, copper powder, lead powder, gold powder, silver dust, glass fiber, titanic acid potassium whisker, carbon whisker, sapphire whisker, beryllia whisker, boron carbide whisker, silicon carbide whisker, silicon nitride whisker, glass beads, hollow glass beads, metaloxides and potassium titanate whisker), antioxidants, wetting agents, photosensitizers for the free-radical photoinitiator, chain transfer agents, leveling agents, defoamers, surfactants and the like.

In accordance with an embodiment of the invention, the liquid radiation curable resin composition contains the polymerizable components such that the desired photosensitivity is obtained by choosing an appropriate ratio of the initiators and/or polymerizable components. The ratio of the components and of the initiators affect the photosensitivity, speed of curing, degree of curing, crosslink density, thermal properties (e.g., $T_g$), and/or mechanical properties (e.g., tensile strength, storage modulus, loss modulus) of the liquid radiation curable resin composition or of the cured article.

Accordingly, in an embodiment, the ratio by weight of cationic photoinitiator to free-radical photoinitiator (CPI/RPI) is less than about 4.0, preferably from about 0.1 to about 2.0, and more preferably from about 0.2 to about 1.0.

In accordance with an embodiment, the liquid radiation curable resin composition has a ratio by weight of cationic polymerizable component to free-radical polymerizable component (CPC/RPC) is less than about 7.0, or less than about 5.0, e.g., from about 0.5 to about 2.0, and more preferably from about 1.0 to about 1.5.

The second aspect of the instant claimed invention is a three-dimensional article having at least one selectively colored and/or transparent region made using an additive fabrication process, wherein a liquid radiation curable resin used to create the article comprises from about 0.005 wt % to about 5 wt % of at least one thermally sensitive visual effect initiator.

The third aspect of the instant claimed invention is a liquid radiation curable resin wherein the liquid radiation curable resin composition comprises at least two thermally sensitive visual effect initiators.

By incorporating more than one thermally sensitive visual effect initiator into the liquid radiation curable resin, different levels of color and/or transparency can be achieved. In an embodiment, more than one thermally sensitive visual effect initiator can be incorporated into the liquid radiation curable resin wherein the more than one thermally sensitive visual effect initiators all have the same activation and locking temperatures in order to obtain unique combinations of color and/or transparency.

By incorporating more than one thermally sensitive visual effect initiator into the liquid radiation curable resin, wherein each thermally sensitive visual effect initiator has a different temperature requirement for activation, a three-dimensional article can have multiple colors or transparencies by selectively varying the local temperature during cure. For instance, an article having three different colors, transparencies, or some combination, would have two thermally sensitive visual effect initiators and be exposed to three different local temperatures during cure, for instance by irradiation with three different doses of light. A first dose would be used to cure the article without activating either component. A second dose, higher than the first dose, would be used to activate one of the thermally sensitive visual effect initiators in the areas exposed to the second dose of light. A third dose, higher than the first dose and the second dose, would activate both thermally sensitive visual effect initiators in the areas exposed to the third dose of light, thus producing an article possessing multiple different colors and/or transparency levels in some areas and optionally clear and substantially colorless in other areas. The amount of thermally sensitive visual effect initiators added to a liquid radiation curable resin and the amount of different doses of light used to irradiate the liquid radiation curable resin have no limit as long as the temperature of the resin can be appropriately controlled.

The fourth aspect of the instant claimed invention is a method of forming a three-dimensional article having regions of selective color and/or transparency from a liquid radiation curable resin comprising the steps:

curing a layer of a liquid radiation curable resin using light, thereby forming a cured solid polymeric layer;

irradiating selected areas of the cured solid polymeric layer resulting from step (a), a previously cured solid polymeric layer, or a layer of the liquid radiation curable resin with a higher dose of light than used in step (a) thereby removing color and/or altering the transparency of the areas irradiated with the higher dose of light.

repeating steps (a) and (b) on a previously cured solid polymeric layer or a layer of the liquid radiation curable resin, as necessary, until the desired three-dimensional article having selectively colored and/or transparent regions is formed;

wherein the wavelength(s) of light in each of steps (a) and (b) are the same, and step (b) can be performed before, during, or after step (a).

In this method, the resin has a first level of color and/or transparency after performance of step (a), and has a different level of color and/or transparency after performance of step (b). Steps (a) and (b) can be performed in either order or simultaneously. The number of times that steps (a) and (b) can be repeated according to step (c) depends on the thickness of the polymeric layers and the size of the three-dimensional article being created. The polymeric layers do not need to all be of the same depth or thickness.

When step (b) is performed, the color and/or transparency of the areas illuminated with light is altered, thus forming a selectively colored and/or transparent article. It is possible to omit step (b) on certain layers in order to not alter the color and/or transparency of any section of that layer. It is also possible to omit step (a) on certain layers in order to only alter the color and/or transparency in any section of that layer.

The dose of light used in step (b) is higher than the dose of light used in step (a). In an embodiment, the dose of light used in step (b) is at least two times the dose used in step (a). The higher dose of light can be achieved by, for example, increasing the length of time that the light illuminates the layer of the composition. The higher dose of light can also be achieved by increasing the intensity of the light used to illuminate the layer of the composition. Those skilled in the art of three-dimensional article production by additive fabrication understand how to adjust the machine to change the intensity of the light source and to irradiate a layer with a higher dose of light.

In an embodiment, only a single dose of light is used to cure a liquid radiation curable resin comprising at least one thermally sensitive visual effect initiator thereby altering the color and/or the transparency from all of the liquid radiation curable resin or none of the liquid radiation curable resin. Additional steps can be added to the fourth aspect of the instant claimed invention such that lights of higher doses can be used in order to activate additional thermally sensitive visual effect initiators.

The wavelength of the light used to cure the liquid radiation curable resin is preferably greater than about 100 nm and less than about 900 nm. More preferably, the wavelength of the light is between about 200 nm and about 700 nm. More preferably, the wavelength of the light is between about 250 nm and about 450 nm, more preferably between 300 and 415 nm.

In an embodiment, the liquid radiation curable resin used in the fourth aspect of the instant claimed invention comprises at least one thermally sensitive visual effect initiator. In another embodiment, the liquid radiation curable resin used in the fourth aspect of the instant claimed invention comprises at least one thermochromic component. In an embodiment, the liquid radiation curable resin used in the fourth aspect of the instant claimed invention comprises at least one thermally sensitive transparency modifier.

In another embodiment, the additional step of overexposing a cured solid polymeric layer formed in step (b) or step (c) is performed. Overexposing the cured solid polymeric layer causes the layer to be somewhat burned and will allow further change in the color or shade of the cured solid polymeric layer. Those skilled in additive fabrication machine operation know how to overexpose a cured solid polymeric layer in order to manipulate the shade or color of the cured solid polymeric layer.

In some embodiments, the light source used to cure the liquid radiation curable resin is a laser such as a He—Cd laser or an Argon ion laser. Such lasers are common on commercially available stereolithography machines and known in the art. In other embodiments, the light source is a light-emitting diode (LED). In other embodiments, the light source is a lamp. In still further embodiments, the light is delivered to the liquid radiation curable resin using an image produced from a DMD (digital micromirror device) chip or LCD display. At least two intensities can be created by a single light source or by multiple light sources. In an embodiment, a single light source is used. In another embodiment, a second light source is used in combination with the first light source to increase the light intensity delivered to certain areas of the radiation curable resin.

It is possible that the color or transparency change will be insufficient in some areas of the cured three-dimensional article after polymerization. This occurrence is most likely at the edges of the part where it is more difficult to locally control the temperature during curing. In order to alter the color and/or transparency after curing of the liquid radiation curable resin, the cured three-dimensional article can be locally heated in those areas. Such local heating can be accomplished with any heat source that can provide local heat, such as a heat gun or small torch.

The fifth aspect of the instant claimed invention is a method of forming a three-dimensional article having selectively colored and/or transparent regions made from a liquid radiation curable resin wherein the coloration and/or transparency of the selectively colored and/or transparent regions is created by selectively controlling the temperature of the liquid radiation curable resin.

In an embodiment, the liquid radiation curable resin used in the fifth aspect of the instant claimed invention comprises at least one thermally sensitive visual effect initiator. In another embodiment, the liquid radiation curable resin used in the fifth aspect of the instant claimed invention comprises at least one thermochromic component. In an embodiment, the liquid radiation curable resin used in the fifth aspect of the instant claimed invention comprises at least one thermally sensitive transparency modifier.

The sixth aspect of the instant claimed invention is a three-dimensional article having colored and uncolored sections produced via an additive fabrication process that when exposed to fluorescent light for 30 days at ambient temperature attains a $\Delta E^*$ measured throughout the exposure to fluorescent light that remains within 50% of the $\Delta E^*$ measured on the first day of the exposure to fluorescent light, preferably the $\Delta E^*$ measured through the exposure to fluorescent light remains within 30% of the $\Delta E^*$ measured on the first day of the exposure to fluorescent light, more preferably the $\Delta E^*$ measured through the exposure to fluorescent light remains within 15% of the $\Delta E^*$ measured on the first day of the exposure to fluorescent light, even more preferably the $\Delta E^*$ measured through the exposure to fluorescent light remains within 10% of the $\Delta E^*$ measured on the first day of the exposure to fluorescent light.

The seventh aspect of the instant claimed invention is a method of forming a three-dimensional article having selectively colored and/or transparent regions from a liquid radiation curable resin comprising the steps of a. selectively curing a layer of liquid radiation curable resin with at least two different doses of light thereby forming a cured solid layer with selectively colored and/or transparent regions b. juxtaposing at least two cured solid layers formed from step (a) in order to form a three-dimensional article.

The eight aspect of the instant claimed invention is a liquid radiation curable resin composition capable of curing into a solid upon irradiation comprising from 0.005 wt % to 5 wt % of at least one thermally sensitive visual effect initiator, preferably from 0.005 wt % to 3 wt. %, more preferably from 0.005 wt % to 2.5 wt. %, even more preferably from 0.005 wt % to 1 wt %, even more preferably from 0.005 wt % to 0.5 wt %, of the at least one thermally sensitive visual effect initiator.

The following examples further illustrate the invention but, of course, should not be construed as in any way limiting its scope.

EXAMPLES

Some example compositions are made by adding 0.3 wt % of Thermolock® 79s Pink to Clear to commercially available SOMOS® WaterClear® Ultra 10122 liquid radiation curable resin and then mixed in a mixer for approximately 15 minutes until combined. Additional comparative example compositions are made using the commercially available Renshape® SL Y-C 9300 liquid radiation curable resin, available from Huntsman Advanced Materials, without adding any other components. All three-dimensional articles were not coated with any protective clear coat for these tests.

Rectangular parts of size 3.0 in×0.25 in×1.5 in (7.62 cm×0.635 cm×3.81 cm) are created. One half of this part (1.5 in×0.25 in×1.5 in or 3.81 cm×0.635 cm×3.81 cm) is selected to be colored while the other half is selected to have no color. These parts are built using a Coherent AVIA 355-1800 Solid State Laser. The spot diameter is 0.0277 cm in the y-direction and 0.0245 cm in the x-direction. The frequency is set to 80 kHz giving a laser power of 91 mW at the part. The stereolithography machine used is an experimental Solid State Imaging machine built by DuPont in 1990. Parts are designed and built using Soliform software. The parts are built using a 0.007 inch (0.1778 mm) slice layer, 3 mil engagement, 0.001 inch scan spacing, varying the line width (which varies the scan speed) to change the exposure each part receives. Pink parts are created using a 68 linewidth (corresponding to a 725.6 cm/sec scan speed). Parts having no color are created when the linewidth is either a 144 linewidth (437.2 cm/sec scan speed) or a 184 linewidth (343.2 cm/sec scan speed). A 40 seconds dip wait time is used between layers to dissipate heat. The temperature of the resin in this machine can be controlled by external heaters. The parts were made with a resin vat temperature of 32+/−4° C. The parts are cleaned using isopropanol.

Comparative example parts of similar dimensions are created using commercially available Renshape® ST Y-C 9300 material, available from Huntsman Advanced Materials. These parts are built on a SLA-5000 machine. No clear coat is added to the Kenshape® SL Y-C 9300 parts. These parts show a great deal of sag and curl. In order to obtain the proper shape, the parts are wet sanded with 600 grit sand paper, followed by a 1000 grit, then 2000 grit paper sanding. The sanding is followed by a Novis 1 buffing wheel. The example compositions in wt % are shown below in Table 1. CE is meant to signify a comparative example that is not to be construed as an example of the invention.

TABLE 1

| | Component | | | |
|---|---|---|---|---|
| Example | Somos® WaterClear Ultra 10122 | Thermolock® 79s Pink to Clear | Renshape® SL Y-C 9300 | Line Width |
| 1 | 99.7 | 0.3 | 0 | 184 |
| 2 | 99.7 | 0.3 | 0 | 184 |
| 3 | 99.7 | 0.3 | 0 | 184 |
| 4 | 99.7 | 0.3 | 0 | 144 |
| 5 | 99.7 | 0.3 | 0 | 144 |
| 6 | 99.7 | 0.3 | 0 | 144 |
| CE1 | 0 | 0 | 100 | |
| CE2 | 0 | 0 | 100 | |
| CE3 | 0 | 0 | 100 | |

Transmittance, Haze, and Clarity

Transmittance, Haze, and Clarity measurements are taken using a BYK-Gardner haze-gard plus (0° diffuse geometry using an illuminant C) on several samples. Transmittance is the ratio of transmitted light to the incident light; it is influenced by the absorption and reflection properties of the sample. Haze is defined by ASTM D 1003 as that percentage of light which in passing through deviates from the incident beam greater than 2.5 degrees on average. Clarity is the narrow angle scattered light. Additional information on the measurement equipment and methodology can be found in *QC Solutions for Coatings and Plastics* 2005-2006, © 2004 BYK-Gardner Instruments, incorporated herein by reference. The test results are shown in Table 2. Each reported value for transmission, haze, or clarity, is the result of the average of five readings taken from five randomly selected areas of the sample. The ideal result for the clear section is a low haze value and a high clarity value. The ideal result for the colored section is a high haze value and a low clarity value.

TABLE 2

| | | Clear | | Pink | |
|---|---|---|---|---|---|
| | | Average | St. Dev. | Average | St. Dev. |
| Example 1 | Trans | 82.4 | 0.06 | 48.1 | 0.26 |
| | Haze | 23.4 | 1.07 | 63.4 | 3.34 |
| | Clarity | 92.6 | 1.23 | 73.2 | 3.62 |
| Example 2 | Trans | 82.3 | 0.06 | 44.1 | 0.71 |
| | Haze | 25.4 | 0.9 | 93.4 | 1.5 |
| | Clarity | 84.4 | 5.39 | 25.4 | 5.12 |
| Example 3 | Trans | 82.6 | 0.1 | 49.2 | 0.17 |
| | Haze | 22.5 | 0.87 | 63.3 | 0.95 |
| | Clarity | 93.5 | 1.77 | 79.3 | 6.29 |

TABLE 2-continued

| | | Clear | | Pink | |
|---|---|---|---|---|---|
| | | Average | St. Dev. | Average | St. Dev. |
| Example 4 | Trans | 81.6 | 0 | 46.8 | 0 |
| | Haze | 35.8 | 0.79 | 69 | 0.66 |
| | Clarity | 93.7 | 0.38 | 86.4 | 0.15 |
| Example 5 | Trans | 80.4 | 0.67 | 46.2 | 0.53 |
| | Haze | 52.6 | 4.96 | 81.7 | 5.48 |
| | Clarity | 86.3 | 0.7 | 53.2 | 8.98 |
| Example 6 | Trans | 80.7 | 0.36 | 43.14 | 0.76 |
| | Haze | 47 | 1.2 | 95.0 | 0.87 |
| | Clarity | 91.4 | 1.08 | 4.8 | 0.36 |
| Comparative Example 1 | Trans | 88 | 0.21 | 16 | 0.19 |
| | Haze | 92.3 | 0.38 | 31.5 | 0.6 |
| | Clarity | 5.46 | 0.43 | 78.6 | 1.79 |
| Comparative Example 2 | Trans | 88.3 | 0.38 | 16.6 | 0.07 |
| | Haze | 95.5 | 0.49 | 27.9 | 0.57 |
| | Clarity | 4.28 | 0.2 | 74.8 | 0.6 |
| Comparative Example 3 | Trans | 88.4 | 0.07 | 16.3 | 0.32 |
| | Haze | 91.9 | 0.42 | 29.8 | 1.01 |
| | Clarity | 7.64 | 0.44 | 67.4 | 5.05 |

Color Stability

Measurement of color can be performed with a Chroma meter. A Chroma meter can be used to measure either an opaque article or resin, or a transparent or translucent article or resin. When the article or resin is opaque, the color of the article or resin can be used by directly measuring the color with the Chroma meter. However, if the article or resin is transparent or translucent, the color measurement is performed against a white barium sulfate tile background.

The International Commission of Illumination (CIE) publishes the recognized standard on perception of color. The standards can be purchased from the CIE website at http://www.cie.co.at/index.php/Publications/Standards. The CIE also publishes recognized standards on illumination sources such as standard illuminants D65 and Illuminant C. D65 is used to simulate standard average daylight, including UV wavelength light. Illuminant C is used to simulate daylight without UV wavelength light. A Chroma meter will measure three values, 'L', 'a', and 'b'. L is the lightness. The lightness (L) will be 100 for white materials and 0 for totally black materials. The 'a' and 'b' values are used to measure actual color. The 'a' and 'b' values are measured on a scale of −60 to +60. The '−a' value represents green, the '+a' value represents red, the '-b' value represents blue and the '+b' value represents yellow. Parts having 'a' and 'b' values between −20 and 20 will have a rather gray appearance. Parts having 'a' or 'b' values between −20 and −60 or 20 and 60 will be more colorful.

Color stability is measured using a Macbeth Model 7000 Color Eye Colorimeter, a chroma meter. The Macbeth Model 7000 Color Eye Colorimeter is used to measure color inclusively in CIE L*a*b* color space (Illuminant D65-10° deg. Observer). Color readings are measured every 2 to 3 days for a one month period. The change in contrast between the color and uncolored portions of the samples is measured by calculating the total change in color, $\Delta E^*$, between the clear half and the colored half. $\Delta E^*$ is calculated by $\sqrt{\Delta L^2 + \Delta a^2 + \Delta b^2}$. Three conditions are tested. In the control condition, the samples are wrapped in a cloth and placed inside a dark bag inside a dark desk drawer. In the fluorescent light condition, the samples are placed under a standard 25 Watt fluorescent office light (Trimline T8 F25T8 SP35). In the natural light condition, the samples are placed on an East-facing windowsill. The change in the samples' color and contrast over time is recorded. Table 3 represents the control condition, Table 4 represents the fluorescent light condition, and Table 5 represents the natural light condition.

Figure 5:
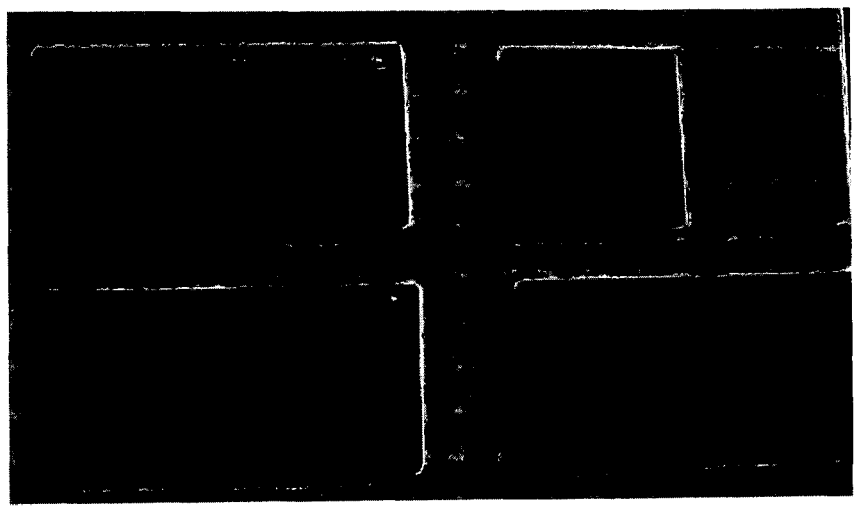
FIG. 5 shows cured three-dimensional articles illustrative of the invention on the left in comparison to examples of the current state of the art on the right after initial cure (top), and after exposure to fluorescent light for 30 days (bottom).

FIG. 5 shows three-dimensional articles made from the composition as used in Example 1, 2, and 3 cured with a line width of 184 in the uncolored regions and 68 in the colored regions (184/68) in comparison to the current state of the art Renshape® SL Y-C 9300. The articles on the top of FIG. 5 (top-left and top-right) show the color of the articles after initial cure. The articles on the bottom of FIG. 5 (bottom-left and bottom-right) show the article after aging under a standard 25 Watt fluorescent office light (Trimline T8 F25T8 SP35) at ambient temperature for 30 days. The inventive examples demonstrate greatly improved color stability.

It was discovered that the examples that contained a thermochromic component possessed a much more constant $\Delta E^*$ over the 30 day test. These examples were shown to have a $\Delta E^*$ measured throughout the duration of the test that remained within 4% of the $\Delta E^*$ measured on the first day of the test for the control condition, a $\Delta E^*$ measured throughout the duration of the test that remained within 7% of the $\Delta E^*$ measured on the first day of the test for the fluorescent light condition, and a $\Delta E^*$ measured throughout the duration of the test that remained within 10% of the $\Delta E^*$ measured on the first day of the test for the natural light condition. The percentage change was calculated by calculating the difference of the $\Delta E.^*$ measured on a particular date and the $\Delta E^*$ measured on the first day, and dividing the result by the $\Delta E^*$ measured on the first day, and multiplying by 100.

TABLE 3

| | Example 1 | | | | | | | Example 4 | | | | | | | Comparative Example 1 | | | | | | |
|---|---|---|---|---|---|---|---|---|---|---|---|---|---|---|---|---|---|---|---|---|---|
| | Clear | | | Pink | | | | Clear | | | Pink | | | | Clear | | | Pink | | | |
| Day | L | a | B | L | a | b | $\Delta E^*$ | L | a | b | L | a | b | $\Delta E^*$ | L | a | b | L | a | b | $\Delta E^*$ |
| 0 | 84.5 | 2.0 | 6.9 | 60.0 | 37.4 | −16.2 | 48.9 | 83.1 | 2.7 | 4.8 | 56.9 | 40.3 | −16.8 | 50.6 | 87.6 | −0.4 | 9.6 | 42.0 | 59.5 | −5.4 | 76.7 |
| 2 | 83.1 | 2.7 | 4.6 | 57.1 | 40.0 | −16.8 | 50.3 | 84.2 | 1.8 | 6.9 | 60.3 | 37.6 | −16.1 | 48.8 | 87.7 | −0.4 | 9.1 | 42.3 | 60.3 | −8.4 | 77.7 |
| 4 | 84.2 | 1.9 | 6.9 | 59.9 | 37.4 | −16.1 | 48.8 | 83.2 | 2.7 | 4.7 | 57.2 | 40.0 | −16.7 | 50.2 | 88.9 | −0.2 | 9.2 | 42.5 | 61.1 | −7.8 | 78.7 |
| 7 | 83.1 | 2.7 | 4.8 | 57.1 | 39.9 | −16.6 | 50.1 | 84.1 | 2.0 | 6.9 | 60.1 | 37.6 | −16.0 | 48.6 | 88.2 | −0.1 | 9.1 | 42.7 | 61.5 | −8.4 | 78.5 |
| 9 | 84.1 | 1.9 | 6.9 | 60.3 | 37.4 | −15.9 | 48.5 | 83.3 | 2.7 | 4.8 | 57.2 | 39.8 | −16.6 | 50.2 | 88.4 | −0.3 | 9.2 | 42.5 | 60.9 | −8.1 | 78.5 |
| 11 | 84.1 | 2.0 | 7.0 | 60.1 | 37.4 | −16.0 | 48.5 | 83.2 | 2.7 | 4.8 | 57.1 | 39.8 | −16.7 | 50.2 | 87.1 | −0.1 | 8.9 | 42.4 | 60.2 | −8.3 | 77.0 |
| 14 | 83.7 | 2.2 | 6.7 | 60.1 | 37.7 | −16.0 | 48.4 | 82.9 | 2.8 | 4.6 | 56.9 | 40.0 | −16.7 | 50.1 | 88.4 | 0.1 | 9.0 | 42.9 | 61.5 | −8.8 | 78.5 |
| 16 | 83.9 | 2.0 | 6.8 | 60.1 | 37.5 | −15.9 | 48.5 | 83.1 | 2.8 | 4.8 | 57.2 | 39.7 | −16.6 | 49.9 | 87.2 | 0.0 | 8.9 | 42.6 | 60.5 | −8.5 | 77.1 |
| 18 | 83.8 | 2.1 | 6.8 | 60.0 | 37.7 | −16.0 | 48.4 | 83.1 | 2.9 | 4.7 | 57.0 | 40.0 | −16.7 | 50.2 | 87.2 | 0.2 | 8.8 | 42.8 | 60.8 | −8.8 | 77.2 |
| 21 | 84.0 | 2.0 | 6.8 | 59.9 | 37.5 | −15.9 | 48.5 | 83.1 | 2.8 | 4.8 | 57.0 | 39.7 | −16.6 | 50.0 | 88.3 | 0.1 | 9.0 | 42.8 | 61.4 | −8.8 | 78.4 |
| 23 | 83.8 | 2.1 | 6.7 | 60.0 | 37.7 | −16.0 | 48.5 | 83.1 | 2.8 | 4.7 | 57.0 | 39.9 | −16.7 | 50.2 | 88.3 | 0.2 | 8.9 | 43.0 | 61.6 | −9.0 | 78.3 |
| 25 | 83.9 | 2.3 | 6.6 | 59.9 | 37.6 | −16.0 | 48.4 | 83.0 | 2.9 | 4.7 | 57.0 | 39.9 | −16.6 | 50.0 | 87.0 | 0.2 | 8.7 | 42.8 | 60.8 | −9.1 | 77.1 |
| 28 | 83.9 | 2.1 | 6.6 | 60.0 | 37.7 | −16.0 | 48.5 | 83.1 | 2.8 | 4.7 | 56.9 | 39.9 | −16.7 | 50.2 | 87.1 | 0.1 | 8.8 | 42.8 | 60.7 | −9.0 | 77.2 |
| 30 | 83.9 | 2.2 | 6.6 | 59.9 | 37.6 | −16.0 | 48.4 | 83.1 | 2.9 | 4.7 | 56.9 | 40.0 | −16.7 | 50.1 | 87.1 | 0.2 | 8.7 | 42.8 | 60.8 | −9.2 | 77.2 |

TABLE 4

| | Example 2 | | | | | | | Example 5 | | | | | | | Comparative Example 2 | | | | | | |
|---|---|---|---|---|---|---|---|---|---|---|---|---|---|---|---|---|---|---|---|---|---|
| | Clear | | | Pink | | | | Clear | | | Pink | | | | Clear | | | Pink | | | |
| Day | L | a | B | L | a | b | $\Delta E^*$ | L | a | b | L | a | b | $\Delta E^*$ | L | a | b | L | a | b | $\Delta E^*$ |
| 0 | 84.2 | 1.7 | 7.0 | 59.8 | 38.0 | −16.3 | 49.5 | 82.7 | 2.8 | 4.8 | 56.5 | 39.9 | −16.6 | 50.2 | 88.2 | −0.5 | 9.9 | 43.0 | 60.9 | −6.5 | 78.1 |
| 2 | 83.9 | 2.1 | 6.6 | 59.6 | 37.7 | −16.0 | 48.6 | 82.7 | 2.9 | 4.6 | 56.7 | 39.8 | −16.4 | 49.7 | 80.6 | 12.8 | 1.4 | 42.9 | 61.1 | −8.8 | 62.1 |
| 4 | 83.7 | 2.2 | 6.5 | 59.7 | 37.6 | −15.8 | 48.2 | 82.4 | 3.0 | 4.5 | 56.6 | 39.8 | −16.5 | 49.6 | 72.9 | 30.7 | −9.3 | 42.3 | 60.3 | −7.7 | 42.7 |
| 7 | 83.6 | 2.6 | 6.3 | 59.6 | 37.8 | −15.7 | 48.0 | 82.2 | 3.2 | 4.5 | 56.8 | 39.9 | −16.3 | 49.3 | 65.1 | 45.2 | −17.3 | 41.9 | 59.5 | −6.4 | 29.4 |
| 9 | 83.6 | 2.5 | 6.3 | 59.6 | 37.6 | −15.6 | 47.9 | 82.2 | 3.2 | 4.5 | 56.7 | 39.8 | −16.2 | 49.2 | 61.4 | 52.2 | −20.8 | 41.6 | 59.2 | −6.0 | 25.7 |
| 11 | 83.6 | 2.4 | 6.4 | 59.6 | 37.4 | −15.4 | 47.7 | 82.2 | 3.1 | 4.6 | 56.7 | 39.6 | −16.0 | 49.0 | 59.7 | 55.1 | −22.2 | 41.5 | 59.1 | −6.1 | 24.6 |
| 14 | 83.2 | 2.8 | 6.2 | 59.6 | 37.6 | −15.2 | 47.2 | 82.0 | 3.3 | 4.6 | 56.6 | 39.7 | −15.8 | 48.9 | 56.7 | 58.3 | −23.1 | 41.4 | 58.3 | −5.4 | 23.4 |
| 16 | 83.4 | 2.7 | 6.3 | 59.5 | 37.4 | −15.1 | 47.3 | 82.0 | 3.3 | 4.6 | 56.5 | 39.7 | −15.8 | 48.8 | 55.5 | 60.7 | −23.6 | 41.3 | 58.5 | −4.8 | 23.7 |
| 18 | 83.4 | 2.6 | 6.3 | 59.4 | 37.5 | −15.1 | 47.4 | 82.0 | 3.4 | 4.6 | 56.5 | 39.7 | −15.7 | 48.8 | 55.2 | 62.4 | −24.2 | 41.1 | 58.2 | −4.4 | 24.7 |
| 21 | 83.5 | 2.6 | 6.5 | 59.8 | 37.2 | −14.8 | 47.0 | 82.1 | 3.3 | 4.8 | 56.5 | 39.2 | −15.4 | 48.5 | 52.9 | 61.9 | −23.6 | 40.7 | 57.1 | −3.9 | 23.6 |
| 23 | 83.4 | 2.7 | 6.4 | 59.6 | 37.4 | −14.8 | 47.1 | 82.1 | 3.4 | 4.7 | 56.7 | 39.6 | −15.5 | 48.6 | 52.5 | 63.9 | −23.7 | 40.9 | 57.8 | −3.8 | 23.8 |
| 25 | 83.2 | 2.7 | 6.3 | 59.6 | 37.6 | −14.9 | 47.1 | 82.0 | 3.4 | 4.7 | 56.6 | 39.5 | −15.3 | 48.5 | 50.7 | 63.7 | −23.6 | 40.6 | 56.8 | −3.3 | 23.7 |
| 28 | 83.3 | 2.7 | 6.4 | 59.7 | 37.4 | −14.7 | 46.9 | 82.0 | 3.3 | 4.7 | 56.5 | 39.2 | −15.2 | 48.3 | 49.8 | 63.5 | −22.4 | 40.4 | 56.5 | −2.7 | 22.9 |
| 30 | 83.2 | 2.9 | 6.4 | 59.6 | 37.4 | −14.5 | 46.7 | 82.0 | 3.4 | 4.8 | 56.6 | 39.4 | −15.1 | 48.3 | 49.9 | 65.8 | −23.5 | 40.5 | 57.0 | −3.0 | 24.2 |

TABLE 5

| | Example 3 | | | | | | | Example 6 | | | | | | | Comparative Example 3 | | | | | | |
|---|---|---|---|---|---|---|---|---|---|---|---|---|---|---|---|---|---|---|---|---|---|
| | Clear | | | Pink | | | | Clear | | | Pink | | | | Clear | | | Pink | | | |
| Day | L | a | B | L | a | b | $\Delta E^*$ | L | a | b | L | a | b | $\Delta E^*$ | L | a | b | L | a | b | $\Delta E^*$ |
| 0 | 84.6 | 1.8 | 6.7 | 59.8 | 38.0 | −16.3 | 49.5 | 82.2 | 3.0 | 4.5 | 56.0 | 40.2 | −16.6 | 50.1 | 88.4 | −0.5 | 9.7 | 42.9 | 60.5 | −6.0 | 77.8 |
| 2 | 84.4 | 2.3 | 6.6 | 59.8 | 37.9 | −15.8 | 48.7 | 82.2 | 3.2 | 4.9 | 56.4 | 39.7 | −15.9 | 49.2 | 84.9 | 4.8 | 7.0 | 42.5 | 59.7 | −6.2 | 70.6 |
| 4 | 84.2 | 2.5 | 6.5 | 59.6 | 37.8 | −15.1 | 48.1 | 81.7 | 3.4 | 5.0 | 56.3 | 39.5 | −15.2 | 48.5 | 75.8 | 21.7 | −1.1 | 41.8 | 58.0 | −3.0 | 49.8 |
| 7 | 83.9 | 2.7 | 6.7 | 59.4 | 37.7 | −14.4 | 47.7 | 81.5 | 3.7 | 5.4 | 56.2 | 39.4 | −14.4 | 48.0 | 68.1 | 36.7 | −6.9 | 41.6 | 57.3 | −0.3 | 34.2 |

TABLE 5-continued

| | Example 3 | | | | | | | Example 6 | | | | | | | Comparative Example 3 | | | | | | |
|---|---|---|---|---|---|---|---|---|---|---|---|---|---|---|---|---|---|---|---|---|---|
| | Clear | | | Pink | | | | Clear | | | Pink | | | | Clear | | | Pink | | | |
| Day | L | a | B | L | a | b | ΔE* | L | a | b | L | a | b | ΔE* | L | a | b | L | a | b | ΔE* |
| 9  | 81.4 | 3.7 | 5.5 | 56.0 | 39.3 | −14.0 | 47.8 | 81.4 | 3.7 | 5.5 | 56.0 | 39.3 | −14.0 | 47.8 | 62.4 | 46.6 | −10.7 | 41.5 | 57.0 | −0.3 | 25.5 |
| 11 | 83.7 | 2.9 | 7.0 | 59.2 | 37.5 | −13.7 | 47.1 | 81.2 | 3.7 | 5.7 | 55.9 | 39.2 | −13.6 | 47.7 | 58.3 | 52.9 | −12.9 | 41.1 | 56.5 | 0.1 | 21.9 |
| 14 | 83.5 | 3.1 | 7.0 | 59.1 | 37.7 | −13.4 | 46.9 | 81.0 | 4.0 | 5.7 | 55.9 | 39.3 | −13.3 | 47.3 | 55.3 | 58.1 | −17.2 | 40.8 | 56.0 | 1.0 | 23.3 |
| 16 | 83.3 | 3.2 | 7.2 | 59.0 | 37.6 | −13.1 | 46.7 | 80.7 | 4.1 | 5.9 | 55.7 | 39.3 | −13.0 | 47.2 | 53.1 | 59.2 | −14.6 | 40.3 | 54.4 | 3.9 | 23.0 |
| 18 | 83.1 | 3.4 | 7.4 | 58.8 | 37.6 | −12.5 | 46.4 | 80.6 | 4.2 | 6.1 | 55.6 | 39.3 | −12.4 | 46.9 | 51.3 | 59.8 | −12.9 | 40.2 | 54.4 | 3.9 | 20.8 |
| 21 | 82.9 | 3.4 | 7.9 | 58.6 | 37.2 | −11.4 | 45.8 | 80.4 | 4.4 | 6.6 | 55.4 | 38.9 | −11.4 | 46.3 | 49.2 | 59.8 | −10.8 | 39.7 | 53.6 | 4.9 | 19.4 |
| 23 | 82.8 | 3.6 | 7.9 | 58.4 | 37.7 | −11.2 | 46.1 | 80.2 | 4.6 | 6.6 | 55.3 | 39.2 | −11.2 | 46.3 | 49.4 | 60.8 | −12.1 | 39.8 | 53.6 | 4.7 | 20.6 |
| 25 | 82.6 | 3.7 | 7.9 | 58.2 | 37.7 | −11.1 | 46.0 | 79.9 | 4.7 | 6.8 | 55.1 | 39.3 | −11.0 | 46.2 | 47.0 | 60.3 | −9.2 | 39.2 | 52.5 | 7.3 | 19.8 |
| 28 | 82.4 | 4.0 | 8.2 | 57.9 | 37.8 | −10.5 | 45.7 | 79.7 | 5.1 | 6.9 | 54.5 | 39.4 | −10.4 | 45.9 | 45.7 | 60.0 | −8.1 | 39.2 | 52.1 | 7.1 | 18.3 |
| 30 | 82.2 | 3.9 | 8.2 | 57.9 | 37.8 | −10.3 | 45.6 | 79.6 | 5.0 | 7.0 | 54.9 | 39.2 | −10.2 | 45.6 | 45.7 | 60.5 | −8.9 | 39.2 | 52.3 | 6.5 | 18.7 |

Additional example compositions are made by adding 0.05 wt % of expandable microspheres (Expance® 031 DUX 40) to commercially available SOMOS® WaterClear® Ultra 10122 liquid radiation curable resin and then mixed in a mixer for approximately 30 minutes until combined.

Rectangular parts of size 3.0 in×0.25 in×1.5 in (7.62 cm×0.635 cm×3.81 cm) are created. One half of this part (1.5 in×0.25 in×1.5 in or 3.81 cm×0.635 cm×3.81 cm) is selected to be white while the other half is selected to be clear and colorless. The parts are built using a SLA 250 stereolithography system manufactured by 3D Systems with a tripled Nd:YAG solid-state laser. The laser has a 355 nm wavelength, 40 ps pulse duration, 100 MHz pulse repetition rate giving an average power of 400 mW. The beam diameter is 1 mm and has a 0.5 mrad divergence. The parts are built using a 0.006 (0.1524 mm) inch slice layer, varying the hatch spacing, hatch overcure and border overcure to change the exposure each part receives. The clear area of the parts is created using a 0.004 inch hatch spacing, −0.002 hatch overcure, 0.002 border overcure with 2 additional borders. The white opaque area of the parts is created with a 0.0025 inch hatch spacing, 0.006 hatch overcure, 0.010 border overcure with 2 additional borders. The temperature of the resin in this machine can be controlled by external heaters. The parts were made with a resin vat temperature of 30+/−4° C. The parts are cleaned using isopropanol, air dried, and undergo a post process cure of 30 minutes per side.

The formulas of the example compositions are shown in Table 6.

TABLE 6

| | Component | |
|---|---|---|
| Example | Somos ® WaterClear Ultra 10122 | Expancel ® 031 DUX 40 |
| 7 | 99.95 | 0.05 |
| 8 | 99.95 | 0.05 |
| 9 | 99.95 | 0.05 |

Color stability is measured using a Macbeth Model 7000 Color Eye Colorimeter in accordance with the method for color stability discussed above. The change in the samples' color and contrast over time is recorded. Table 7 represents the control condition, Table 8 represents the fluorescent light condition, and Table 9 represents the natural light condition. A ΔE* of N/M means that no color readings were measured on that day and, consequently, a ΔE* could not be calculated on that day. Excellent ΔE* stability was achieved for the example compositions in comparison to the poor ΔE* stability of the prior art compositions in Comparative Example 1, 2, and 3. The ΔE* measured throughout the test stayed within 20% of the ΔE* measured on the first day of the test for all three light conditions.

TABLE 7

| | Example 7 | | | | | | |
|---|---|---|---|---|---|---|---|
| | Clear | | | White | | | |
| Day | L | a | b | L | a | b | ΔE* |
| 0  | 73.1 | −1.3 | 1.3 | 62.2 | −2.9 | 12.4 | 15.6 |
| 2  | 73.2 | −1.3 | 1.4 | 62.2 | −2.7 | 12.7 | 15.8 |
| 4  | 73.1 | −1.3 | 1.5 | 61.5 | −2.6 | 13.0 | 16.5 |
| 7  | 73.0 | −1.4 | 1.5 | 61.4 | −2.5 | 13.6 | 16.7 |
| 9  | 73.1 | −1.4 | 1.6 | 61.1 | −2.5 | 13.6 | 17.0 |
| 11 | N/M | N/M | N/M | N/M | N/M | N/M | N/M |
| 14 | N/M | N/M | N/M | N/M | N/M | N/M | N/M |
| 15 | 72.9 | −1.4 | 1.7 | 61.4 | −2.3 | 14.4 | 17.1 |
| 16 | N/M | N/M | N/M | N/M | N/M | N/M | N/M |
| 18 | N/M | N/M | N/M | N/M | N/M | N/M | N/M |
| 21 | 73.1 | −1.4 | 1.8 | 61.7 | −2.3 | 14.7 | 17.2 |
| 23 | 73.1 | −1.4 | 1.8 | 61.8 | −2.3 | 14.9 | 17.3 |
| 25 | 73.0 | −1.4 | 1.8 | 61.1 | −2.3 | 14.5 | 17.5 |
| 28 | 73.1 | −1.4 | 1.8 | 61.2 | −2.2 | 14.7 | 17.5 |
| 30 | 73.3 | −1.4 | 1.9 | 61.2 | −2.2 | 14.6 | 17.6 |

TABLE 8

| | Example 8 | | | | | | |
|---|---|---|---|---|---|---|---|
| | Clear | | | White | | | |
| Day | L | a | b | L | a | b | ΔE* |
| 0  | 73.8 | −1.3 | 1.6 | 61.7 | −2.9 | 11.8 | 16.0 |
| 2  | 73.8 | −1.1 | 1.2 | 62.0 | −2.6 | 10.8 | 15.3 |
| 4  | 73.5 | −1.0 | 1.3 | 62.6 | −2.2 | 10.1 | 14.1 |
| 7  | 73.6 | −1.0 | 1.4 | 61.4 | −1.9 | 10.0 | 15.0 |
| 9  | 73.4 | −0.9 | 1.5 | 61.4 | −1.8 | 10.2 | 14.8 |
| 11 | N/M | N/M | N/M | N/M | N/M | N/M | N/M |
| 14 | N/M | N/M | N/M | N/M | N/M | N/M | N/M |
| 15 | 73.3 | −0.8 | 1.8 | 61.2 | −1.4 | 9.9 | 14.6 |
| 16 | N/M | N/M | N/M | N/M | N/M | N/M | N/M |
| 18 | N/M | N/M | N/M | N/M | N/M | N/M | N/M |
| 21 | 72.9 | −0.7 | 2.0 | 62.6 | −1.0 | 9.5 | 12.8 |
| 23 | 72.9 | −0.7 | 2.1 | 61.7 | −0.9 | 9.6 | 13.5 |
| 25 | 72.8 | −0.7 | 2.2 | 61.2 | −0.8 | 9.7 | 13.9 |
| 28 | 72.9 | −0.6 | 2.3 | 60.9 | −0.7 | 9.7 | 14.1 |
| 30 | 72.5 | −0.6 | 2.3 | 60.9 | −0.6 | 9.6 | 13.7 |

TABLE 9

Example 9

| | Clear | | | White | | | |
|---|---|---|---|---|---|---|---|
| Day | L | a | b | L | a | B | ΔE* |
| 0 | 72.5 | −1.3 | 1.5 | 62.6 | −2.9 | 13.3 | 15.5 |
| 2 | 72.4 | −1.2 | 2.1 | 62.0 | −1.6 | 12.2 | 14.4 |
| 4 | 71.9 | −1.1 | 2.5 | 61.9 | −0.5 | 11.9 | 13.7 |
| 7 | 71.7 | −1.0 | 3.2 | 61.1 | 0.8 | 11.6 | 13.6 |
| 9 | 71.2 | −0.9 | 3.5 | 60.9 | 1.1 | 11.7 | 13.3 |
| 11 | N/M | N/M | N/M | N/M | N/M | N/M | N/M |
| 14 | N/M | N/M | N/M | N/M | N/M | N/M | N/M |
| 15 | 70.9 | −0.4 | 4.1 | 59.7 | 2.8 | 11.3 | 13.6 |
| 16 | N/M | N/M | N/M | N/M | N/M | N/M | N/M |
| 18 | N/M | N/M | N/M | N/M | N/M | N/M | N/M |
| 21 | 70.4 | 0.1 | 5.1 | 60.2 | 4.1 | 11.8 | 12.9 |
| 23 | 70.0 | 0.4 | 5.2 | 59.0 | 4.5 | 11.8 | 13.5 |
| 25 | 70.0 | 0.6 | 5.5 | 58.7 | 4.8 | 11.7 | 13.6 |
| 28 | 69.5 | 1.2 | 5.8 | 58.6 | 5.6 | 11.8 | 13.3 |
| 30 | 69.3 | 1.3 | 6.1 | 57.4 | 5.8 | 11.9 | 14.0 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A method of forming a three-dimensional article having at least one selectively colored and/or transparent region comprising subjecting a liquid radiation curable resin comprising at least one thermally sensitive visual effect initiator having an activation temperature to appropriate imaging radiation to form a three-dimensional article layer by layer, while simultaneously selectively controlling the temperature of the liquid radiation curable resin so that at least one portion of the liquid radiation curable resin is at or above the activation temperature of the thermally sensitive visual effect initiator to thereby form the at least one selectively colored and/or transparent region of the three-dimensional article; wherein the thermally sensitive visual effect initiator comprises at least one thermally sensitive transparency modifier which further comprises thermally expandable microspheres; wherein the temperature of the liquid radiation curable resin composition is selectively controlled by selectively irradiating the liquid radiation curable resin composition with at least two different doses of light, and wherein a single light source is used to create the at least two different doses of light.

2. The method of claim 1 further comprising the steps of:
   (a) forming a layer of liquid radiation curable resin;
   (b) selectively curing the layer of liquid radiation curable resin while selectively controlling the temperature of the liquid radiation curable resin thereby forming a cured solid layer with at least one selectively colored and/or transparent region;
   (c) repeating steps (a) and (b) a sufficient number of times in order to build up a three-dimensional article.

3. The method of claim 1 wherein the liquid radiation curable resin comprises a free radical polymerizable component and a photoinitiating system capable of initiating free radical polymerization.

4. The method of claim 1 wherein the liquid radiation curable resin comprises a cationic polymerizable component and a photoinitiating system capable of initiating cationic polymerization.

5. The method of claim 1 wherein the thermally sensitive visual effect initiator is present in an amount, relative to the total weight of the liquid radiation curable resin, from about 0.005 wt % to about 5 wt %.

6. The method of claim 1 wherein the at least one thermally sensitive visual effect initiator comprises at least one thermochromic component.

7. The method of claim 6 wherein the thermochromic component comprises a thermally sensitive ink contained in a microcapsule.

8. The method of claim 1 wherein the thermally sensitive visual effect does not undergo any visual color or transparency change in response to an acid produced during polymerization of the liquid radiation curable resin.

9. The method of claim 1 wherein the at least one thermally sensitive visual effect initiator has a locking temperature and the temperature of the liquid radiation curable resin is selectively controlled so that at least one portion of the liquid radiation curable resin is at or above the locking temperature of the at least one thermally sensitive visual effect initiator.

10. The method of claim 1 wherein the liquid radiation curable resin comprises at least two thermally sensitive visual effect initiators.

11. The method of claim 10 wherein the at least two thermally sensitive visual effect initiators have different locking temperatures.

12. The method of claim 1, wherein the single light source used to create the at least two different doses of light is a light source which emits radiation from 300-475 nm.

13. The method of claim 1, wherein the at least one thermally sensitive visual effect initiator having an activation temperature to appropriate imaging radiation is present in an amount, relative to the total weight of the liquid radiation curable resin, from 0.005 wt % to 0.5 wt %.

14. The method of claim 6, wherein the single light source used to create the at least two different doses of light is a light source which emits radiation from. 300-475 nm.

15. The method of claim 14, wherein the single light source used to create the at least two different doses of light is a solid state laser.

* * * * *